(12) United States Patent
Ausschnitt et al.

(10) Patent No.: US 6,317,211 B1
(45) Date of Patent: Nov. 13, 2001

(54) OPTICAL METROLOGY TOOL AND METHOD OF USING SAME

(75) Inventors: Christopher P. Ausschnitt, Brookfield; Timothy A. Brunner, Ridgefield, both of CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/352,296

(22) Filed: Jul. 12, 1999

Related U.S. Application Data

(60) Division of application No. 08/919,993, filed on Aug. 28, 1997, now Pat. No. 6,130,750, which is a continuation-in-part of application No. 08/643,138, filed on May 2, 1996, now Pat. No. 5,805,290.

(51) Int. Cl.[7] ................................................. G01B 11/00
(52) U.S. Cl. ............................................. 356/401; 356/400
(58) Field of Search ........................... 250/548; 356/400, 356/401

(56) References Cited

U.S. PATENT DOCUMENTS

| | | |
|---|---|---|
| 3,689,162 | 9/1972 | Ferguson . |
| 4,529,314 | 7/1985 | Ports . |
| 4,555,798 | 11/1985 | Broadbent, Jr. et al. . |
| 4,568,189 | 2/1986 | Bass et al. . |
| 4,596,037 | 6/1986 | Bouchard et al. . |
| 4,631,416 | 12/1986 | Trutna, Jr. . |
| 4,659,936 | 4/1987 | Kikkawa et al. . |
| 4,783,826 | 11/1988 | Koso . |
| 4,820,055 | 4/1989 | Müller . |
| 4,853,967 | 8/1989 | Mandeville . |
| 4,865,455 | 9/1989 | Kohno et al. . |
| 4,893,346 | 1/1990 | Bishop . |
| 4,908,656 | 3/1990 | Suwa et al. . |
| 4,908,871 | 3/1990 | Hara et al. . |
| 4,981,372 | 1/1991 | Morimoto et al. . |
| 5,048,968 | 9/1991 | Suzuki . |
| 5,103,104 | 4/1992 | Tissier et al. . |
| 5,119,436 | 6/1992 | Holdgrafer . |
| 5,216,257 | 6/1993 | Bureck et al. . |
| 5,262,258 | 11/1993 | Yanagisawa . |
| 5,272,763 | 12/1993 | Marugyama et al. . |
| 5,309,198 | 5/1994 | Nakagawa . |
| 5,386,294 | 1/1995 | Ototake et al. . |
| 5,402,224 | 3/1995 | Hirukawa et al. . |
| 5,418,613 | 5/1995 | Matsutani . |
| 5,483,345 | 1/1996 | Donaher et al. . |
| 5,629,772 | 5/1997 | Ausschnitt . |
| 5,680,200 | * 10/1997 | Sugaya et al. ........................ 356/401 |
| 5,706,091 | * 1/1998 | Shiraishi ............................... 356/401 |
| 5,805,290 | 9/1998 | Ausschnitt et al. . |

FOREIGN PATENT DOCUMENTS

| | | |
|---|---|---|
| 57-60206(A) | 10/1984 | (GB) . |
| 85-050751 | 4/1982 | (JP) . |

OTHER PUBLICATIONS

Electrical Measurements for Characterizing Lithography, VLSI Electronics Microstructure Science, vol. 16, pp. 320–356, 1987.

\* cited by examiner

Primary Examiner—F. L. Evans
Assistant Examiner—Zandra Smith
(74) Attorney, Agent, or Firm—DeLio & Peterson, LLC; Peter W. Peterson; Tiffany L. Townsend

(57) ABSTRACT

A metrology apparatus for determining bias and overlay errors in a substrate formed by a lithographic process includes an aperture between the objective lens and the image plane adapted to set the effective numerical aperture of the apparatus. The aperture is adjustable to vary the effective numerical aperture of the apparatus and the aperture may be non-circular, to individually vary the effective numerical aperture of the apparatus in horizontal and vertical directions. To determine bias and overlay error there is provided a target having an array of elements on the substrate, the array comprising a plurality of spaced, substantially parallel elements having a length and a width, the sum of the width of an element and the spacing of adjacent elements defining a pitch of the elements, edges of the elements being aligned along a line forming opposite array edges, the distance between array edges comprising the array width.

12 Claims, 13 Drawing Sheets

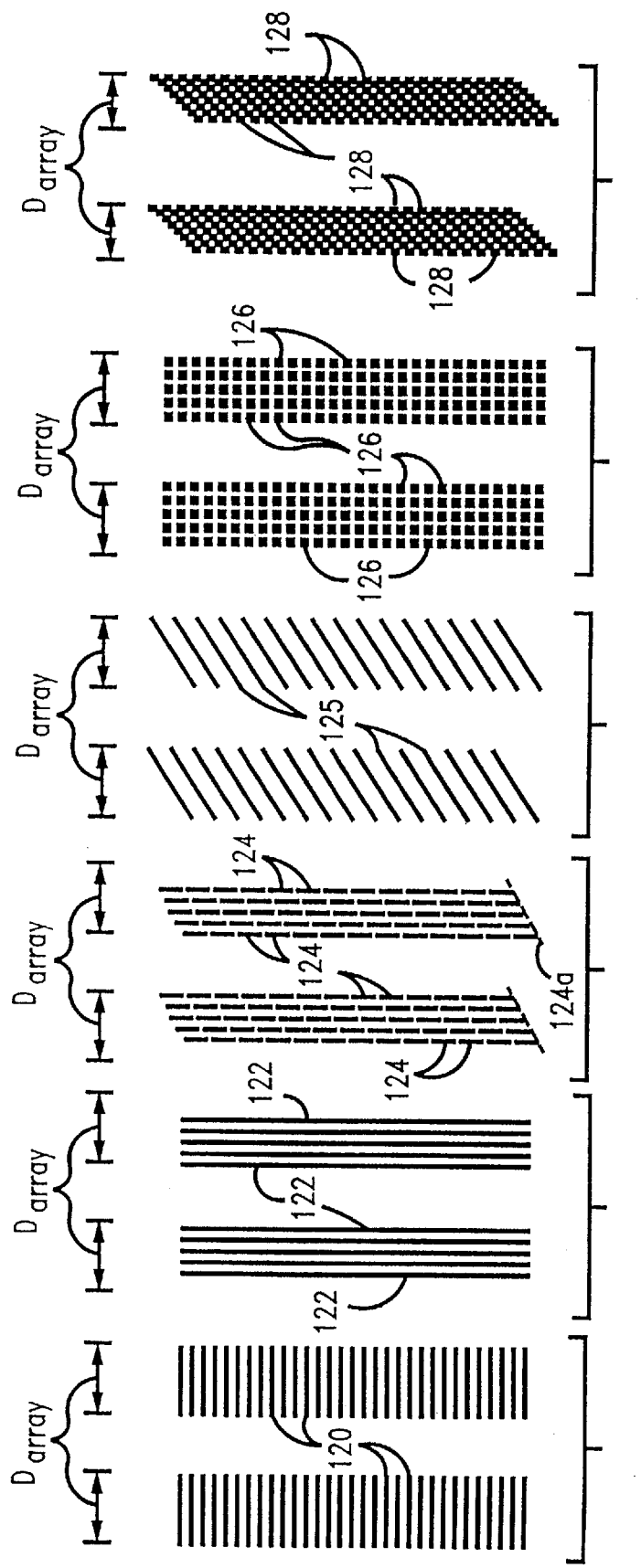

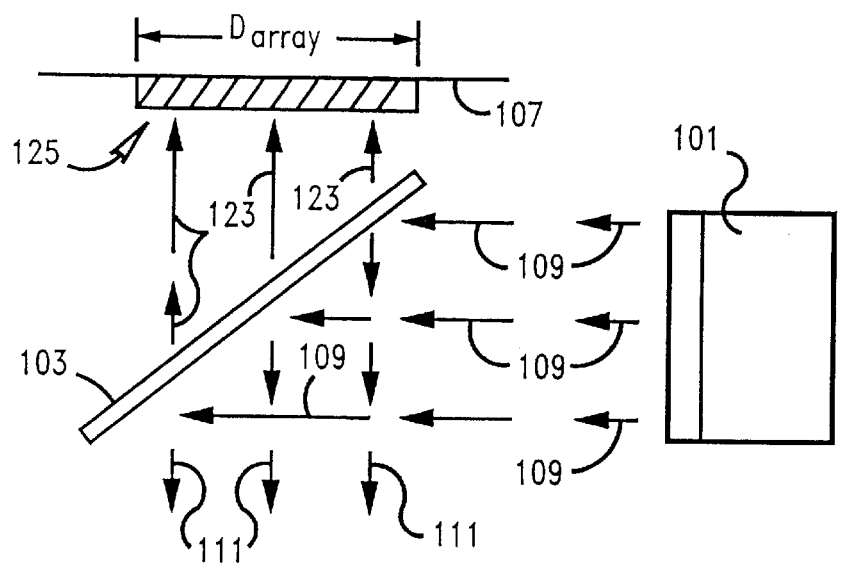
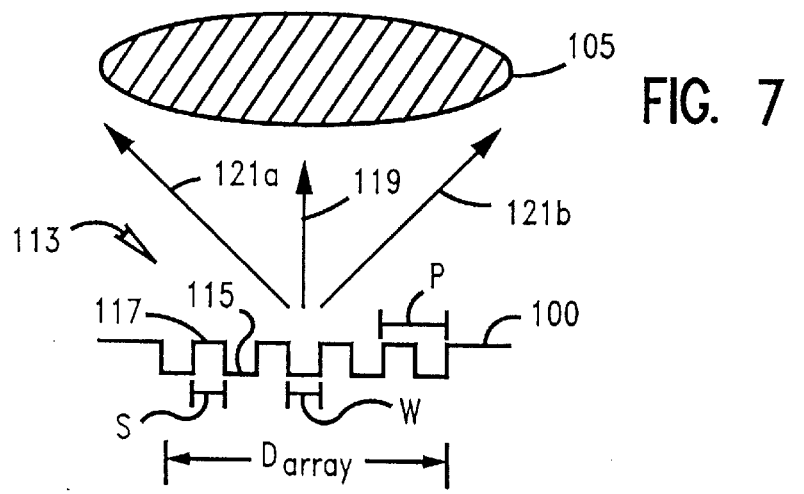
FIG. 7
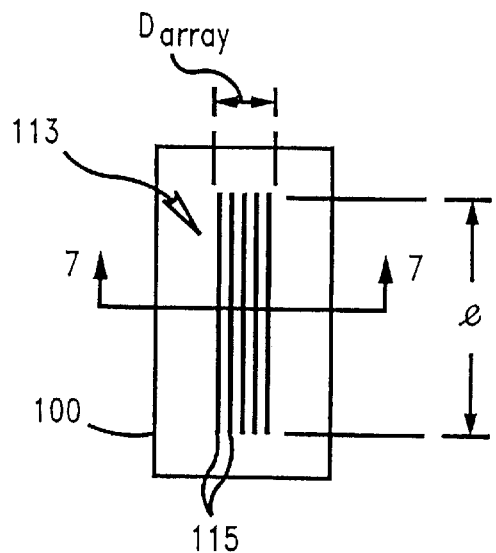
FIG. 8

CONTRAST: $C = (I_{max} - I_{min}) / (I_{max} + I_{min})$
ARRAY WIDTH: $W_m = x_1 - x_2$
ARRAY CENTER: $X_c = (x_1 + x_2)/2$

OPTICAL METROLOGY TOOL AND METHOD OF USING SAME

This is a Div of Ser. No. 08/919,993 filed Aug. 28, 1997 now U.S. Pat. No. 6,130,750, which is a continuation-in-part of U.S. application Ser. No. 08/643,138 now U.S Pat. No. 5,805,290 filed May 2 1996.

BACKGROUND OF THE INVENTION

1. Field of the Invention

The present invention relates generally to lithography manufacturing systems and, more particularly, to an optical metrology tool and system for monitoring of bias in lithographic and etch processes used in microelectronics manufacturing which is particularly useful for monitoring pattern features with dimensions on the order of less than 0.5 micron.

2. Description of Related Art

Lithography has a broad range of industrial applications, including the manufacture of semiconductors, flat-panel displays, micromachines, and disk heads. The lithographic process allows for a mask or reticle pattern to be transferred via spatially modulated light (the aerial image) to a photoresist film on a substrate. Those segments of the absorbed aerial image, whose energy exceeds a threshold energy of chemical bonds in the photo-active component (PAC) of the photoresist material, create a latent image in the photoresist. In some photoresist systems the latent image is formed directly by the PAC. In others (so-called acid catalyzed photoresists), the photo-chemical interaction first generates acids which react with other photoresist components during a post-exposure bake to form the latent image. In either case, the latent image marks the volume of photoresist material that either is removed during the development process (in the case of positive photoresist) or remains after development (in the case of negative photoresist) to create a three-dimensional pattern in the photoresist film.

The principal determinant of the photoresist image is the surface on which the exposure energy equals the photoresist threshold energy in the photoresist film. Exposure and focus are the variables that control the shape of this surface. Exposure, set by the illumination time and intensity, determines the average energy of the aerial image per unit area. Local variations in exposure can be caused by variations in substrate reflectivity and topography. Focus, set by the position of the photoresist film relative to the focal plane of the imaging system, determines the decrease in modulation relative to the in-focus image. Local variations in focus can be caused by variations in substrate film thickness and topography.

Generally, because of the variations in exposure and focus, patterns developed by lithographic processes must be continually monitored or measured to determine if the dimensions of the patterns are within acceptable range. The importance of such monitoring increases considerably as the resolution limit, which is usually defined as minimum features size resolvable, of the lithographic process is approached. The patterns being developed in semiconductor technology are generally in the shape of lines both straight and with bends, having a length dimension equal to and multiple times the width dimension. The width dimension, which by definition is the smaller dimension, is of the order of 0.1 micron to greater than 1 micron in the current leading semiconductor technology. Because the width dimension is the minimum dimension of the patterns, it is the width dimension that challenges the resolution limits of the lithographic process. In this regard, because width is the minimum and most challenging dimension to develop, it is the width dimension that is conventionally monitored to assess performance of the lithographic process. The term "bias" is used to describe the change in a dimension of a feature from its nominal value. Usually the bias of interest is the change in the smallest of the dimensions of a given feature. Further, the term "bias" is invariably used in conjunction with a process such as resist imaging, etching, developing etc. and described by terms such as image bias, etch bias, print bias etc.

Monitoring of pattern features and measurement of its dimensions (metrology) is typically performed using either a scanning electron microscope (SEM) or an optical tool. Current practice in the semiconductor industry is to use topdown SEMs for the in-line metrology of all critical dimensions below approximately 0.7 um. SEM metrology has very high resolving power and is capable of resolving features of the order of 0.1 micron. The SEM measurement is an interpretation of an average intensity profile over a user-defined segment of the topdown image. Unfortunately, SEM metrology is expensive to implement, relatively slow in operation and difficult to automate. The need to reconstruct the three-dimensional pattern on the wafer from its two-dimensional image over the range of conditions encountered in semiconductor processing precludes the accuracy of topdown measurement. In-line measurement of critical dimension (CD) below 0.5 um must currently be made on SEM tools for the control of the lithography and etch sectors. At best, algorithms that attempt to determine the absolute dimensions at a fixed pattern height (e.g., the interface of the pattern with the underlying substrate), are accurate to only 30–50 nm—a substantial fraction, if not all, of current critical dimension tolerance. Thus, to achieve the necessary dimensional control of current and future semiconductor products, topdown SEMs require correlation to methods deemed more accurate, such as, cross-section SEMs, TEMs (transmission electron microscopes) and AFMs (atomic force microscopes). Between such "calibrations", current topdown SEMs are believed to sustain measurement precision on the order of 10 nm (3σ). The extendibility of topdown SEMs to the CD metrology required of future generations of chips is in question. The need to measure individual features below 0.25 um poses a serious challenge not just to their imaging capability, but to all the subsystems required for automated measurement—pattern recognition, gate placement, edge detection, and the like. Even with major improvements in automation, topdown SEMs remain slow and expensive compared to the optical tools used in overlay metrology. Some proposed alternatives, such as the AFM, are likely to be slower and more expensive.

The CD metrology dilemma, summarized above, portends a separation of roles for in-line and off-line metrology in which the "accuracy" of in-line metrology is sacrificed for precision, sensitivity and speed. The principal role of in-line tools will be to maintain the process at predetermined operating points known to correlate to high yield. The in-line metrology will also be able to generate much of the routine process characterization data (e.g., focus-exposure matrices, process window comparisons, swing curves, and the like) where there is a good understanding of the underlying physical effects. The role of off-line metrology tools will be to keep the in-line tools calibrated (maintain correlation to physical attributes of the pattern) and to enable deeper characterization and diagnosis of the patterning process.

The attributes required of in-line metrology tools are sensitivity to process variation, precision, stability, matching, ease of calibration, speed, low cost of ownership and, of course, that they be nondestructive. Optical tools will re-emerge to fulfill this role for CD metrology. The principal attributes required of off-line metrology/inspection tools are a combination of the ability to "see" the chip pattern with precision and accuracy. The topdown SEM is likely to return to an off-line mission where, along with cross-section SEM, TEM, AFM, electrical probe, etc., it will continue to serve an important role. In semiconductor manufacturing, both in-line and off-line metrology remain subservient to the ultimate arbiter—electrical chip performance.

Although optical metrology overcomes the above drawbacks associated with SEM and AFM metrology, optical metrology systems are unable to resolve adequately for measurement of feature dimensions of less than about 1 micron. Additionally, false sensitivity has limited the applicability of optical microscopy to sub-micron metrology on semiconductor product wafers.

The degradation of optical resolution as chip dimensions approach the wavelength of light precludes the application of optical microscopy to the measurement of individual chip features. Even setting aside the accuracy requirement for in-line metrology, the blurred images of adjacent edges overlap and interfere, and the behavior of the intensity profile of the image no longer bears any consistent relationship to the actual feature on the wafer. It is this loss of measurement "consistency" (definable as a combination of precision and sensitivity) that establishes the practical limit of conventional optical metrology in the range of 0.5–1.0 um.

With regard to false sensitivity, the thin films used in semiconductor manufacturing vary widely in their optical characteristics. Optical metrology is susceptible to variations in the thickness, index of refraction, granularity and uniformity of both the patterned layer and underlying layers. Film variations that affect the optical image can be falsely interpreted as variations in the pattern dimension.

Improvements in monitoring bias in lithographic and etch processes used in microelectronics manufacturing have been disclosed in U.S. patent application Ser. Nos. 08/359,797, 08/560,720 and 08/560,851. In Ser. No. 08/560,851, a method of monitoring features on a target using an image shortening phenomenon was disclosed. In Ser. No. 08/560,720, targets and measurement methods using verniers were disclosed to measure bias and overlay error. In these applications, the targets comprised arrays of spaced, parallel elements having a length and a width, with the ends of the elements forming the edges of the array. While the targets and measurement methods of these applications are exceedingly useful, they rely on the increased sensitivity to process variation provided by image shortening.

Accordingly, there is still a need for a method of monitoring pattern features of arbitrary shape with dimensions on the order of less than 0.5 micron, and which is inexpensive to implement, fast in operation and simple to automate. There is a need for a process for determining bias which enables in-line lithography/etch control using optical metrology, and wherein SEM and/or AFM metrology is required only for calibration purposes.

Bearing in mind the problems and deficiencies of the prior art, it is therefore an object of the present invention to provide an optical metrology tool and apparatus for determining bias and overlay error in patterns deposited as a result of lithographic processes.

It is another object of the present invention to provide a method and target for determining bias and overlay error in patterns deposited as a result of lithographic processes.

It is a further object of the present invention to provide a method and target which combines measurement of bias and overlay error in deposited patterns, and which utilize little space on a wafer substrate.

It is yet another object of the present invention to provide bias and edge overlay targets which are readable by optical microscopy.

It is a further object of the present invention to provide a process for measuring bias using targets which are intentionally not resolved by the metrology tool employed.

Still other objects and advantages of the invention will in part be obvious and will in part be apparent from the specification.

SUMMARY OF THE INVENTION

The above and other objects, which will be apparent to those skilled in the art, are achieved in the present invention which provides a process for determining critical dimension bias or overlay error in a substrate formed by a lithographic process by initially providing an array of elements on a substrate, the array comprising a plurality of spaced, substantially parallel elements having a length and a width. The sum of the width of an element and the spacing of adjacent elements define a pitch of the elements. Ends or edges of the elements are aligned along a line forming opposite array edges, with the distance between array edges comprising the array width. Also provided is an optical metrology tool having a light source and an aperture for measuring the length of the array elements. The optical metrology tool is adjustable for one or more of i) wavelength of the light source, ii) numerical aperture value or iii) partial coherence. The process includes selecting the pitch of the elements, the wavelength of the light source, the numerical aperture and the partial coherence such that the pitch of the elements is less than or about equal to the ratio of the wavelength of the light source to the numerical aperture value of the optical metrology tool in the direction of the array edges. Subsequently, the edges of the array are resolved with the optical metrology tool and the width of the array is measured to determine bias or overlay error in the substrate.

Preferably, the pitch corresponds to a minimum feature formed on the substrate and during measurement of the width of the array individual elements are not resolved within the array. The length of the elements of the array may be greater than the width of the elements of the array and measurement is of the length of the elements, or a plurality of spaced elements comprising a row across the width of the array and measurement is of the length of the row of the elements.

In a preferred embodiment, useful where the pitch of the array differs in different directions, the optical metrology tool has a non-circular pupil and the numerical aperture value NA of the optical metrology tool in the direction of minimum array pitch is selected to be less than the numerical aperture value NA of the optical metrology tool in a direction of maximum array pitch, such that the array edges are resolved and individual elements are not resolved.

In a more preferred aspect, the present invention relates to a process for determining bias or overlay error in a substrate formed by a lithographic process. To practice the process, there is provided an array of elements on a substrate, the array comprising a plurality of spaced, substantially parallel elements having a length and a width. The sum of the width of an element and the spacing of adjacent elements define a pitch P of the elements. Ends of the elements are aligned along a straight line forming opposite array edges, with the distance between array edges comprising the array width. There is also provided an optical metrology tool having a light source and an aperture and objective for measuring the length of the array elements. The optical metrology tool is adjustable for one or more of i) wavelength of the light source λ, ii) numerical aperture value NA of the optical metrology tool in the direction of the array edges or iii) partial coherence a In the process, one selects the pitch P of the elements, the wavelength of the light source, the numerical aperture and the partial coherence such that:

$$P < \text{or} \approx \frac{\lambda}{NA(1+\sigma)}$$

whereby individual elements are not resolved within the array. The edges of the array are resolved with the optical metrology tool and the width of the array is measured to determine bias or overlay error in the substrate.

The numerical aperture value NA of the optical metrology tool in the direction of minimum array pitch may be selected to be less than the numerical aperture value NA of the optical metrology tool in a direction of maximum array pitch.

As an improvement to the aforementioned process and apparatus, the present invention also provides a metrology apparatus for determining bias or overlay error in a substrate formed by a lithographic process comprising a light source, an object plane adapted to receive a substrate having thereon a target for determining bias or overlay error in the substrate, an objective lens between the light source and the object plane adapted to focus light from the light source onto a target on the substrate in one direction and focus reflected light containing an image of the target in an opposite direction, and an image plane adapted to receive light containing an image of a target reflected from the object plane. An aperture is provided between the objective lens and the image plane adapted to set the effective numerical aperture of the apparatus. Preferably, the aperture is adjustable to vary the effective numerical aperture of the apparatus and the aperture is non-circular, for example, rectangular, to individually vary the effective numerical aperture of the apparatus in horizontal and vertical directions.

In a related aspect, the invention provides metrology apparatus for determining bias or overlay error in a substrate formed by a lithographic process comprising a light source, an object plane adapted to receive a substrate having thereon a target for determining bias or overlay error in the substrate, an objective lens between the light source and the object plane adapted to focus light from the light source onto a target on the substrate in one direction and focus reflected light containing an image of the target in an opposite direction, and an image plane adapted to receive light containing an image of a target reflected from the object plane. An adjustable, non-circular aperture is provided between the light source and the image plane adapted to vary the effective numerical aperture of the apparatus. Preferably, the aperture is rectangular and is disposed between the objective lens and the image plane, and is further adjustable to individually vary the effective numerical aperture of the apparatus in horizontal and vertical directions.

In a further aspect, the present invention is related to a process for determining bias or overlay error in a substrate formed by a lithographic process comprising the steps of:

a) providing a target having an array of elements on a substrate, the array comprising a plurality of spaced, substantially parallel elements having a length and a width, the sum of the width of an element and the spacing of adjacent elements defining a pitch of the elements, edges of the elements being aligned along a line forming opposite array edges, the distance between array edges comprising the array width;

b) providing an optical metrology tool comprising a source of light having a wavelength; an object plane adapted to receive the substrate having thereon the target; an objective lens between the light source and the object plane adapted to focus light from the light source onto the target on the substrate in one direction and focus reflected light containing an image of the target in an opposite direction; an image plane adapted to receive light containing an image of the target reflected from the object plane; and an adjustable aperture between the objective lens and the image plane adapted to vary the effective numerical aperture of the optical metrology tool;

c) adjusting the numerical aperture such that the pitch of the elements is less than or approximately equal to the ratio of the wavelength of the light source to the numerical aperture value of the optical metrology tool in the direction of the array edges; and d) resolving the edges of the array with the optical metrology tool and measuring the width of the array to determine bias or overlay error in the substrate.

In a preferred embodiment, the pitch corresponds to a minimum feature formed on the substrate and during step (d) individual elements are not resolved within the array. It is also preferred that the aperture of the optical metrology tool is non-circular and, in step (c), the numerical aperture value NA of the optical metrology tool in the direction of the array edges is selected to be different from the numerical aperture value NA of the optical metrology tool in a direction normal to the array edges such that the array edges are resolved and individual elements within the array are not resolved.

Yet another aspect of the present invention provides a process for determining bias or overlay error in a substrate formed by a lithographic process comprising the steps of:

a) providing a target having an array of elements on a substrate, the array comprising a plurality of spaced, substantially parallel elements having a length and a width, the sum of the width of an element and the spacing of adjacent elements defining a pitch of the elements, edges of the elements being aligned along a line forming opposite array edges, the distance between array edges comprising the array width;

b) providing an optical metrology tool comprising a source of light having a wavelength; an object plane adapted to receive the substrate having thereon the target; an objective lens between the light source and the object plane adapted to focus light from the light source onto the target on the substrate in one direction and focus reflected light containing an image of the target in an opposite direction; an image plane adapted to receive light containing an image of the target reflected from the object plane; and an adjustable non-circular aperture between the light source and the image plane adapted to vary the effective numerical aperture of the optical metrology tool;

c) adjusting the numerical aperture such that the pitch of the elements is less than or approximately equal to the ratio of the wavelength of the light source to the numerical aperture value of the optical metrology tool in the direction of the array edges; and d) resolving the edges of the array with the optical metrology tool and measuring the width of the array, without resolving individual elements in the array, to determine bias or overlay error in the substrate.

In a preferred embodiment, the aperture of the optical metrology tool is rectangular and, in step (c), the numerical aperture value NA of the optical metrology tool in the direction of the array edges is selected to be different from the numerical aperture value NA of the optical metrology tool in a direction normal to the array edges such that the array edges are resolved and individual elements within the array are not resolved.

Where the pitch of the elements is defined as P, wherein the wavelength of the light is defined as λ, wherein the numerical aperture is defined as NA, wherein the optical metrology tool has a partial coherence defined as σ, it is preferred that step (c) comprises adjusting the numerical aperture and the partial coherence such that:

$$P < \text{or} \approx \frac{\lambda}{NA(1+\sigma)}$$

whereby individual elements are not resolved within the array of the target.

Preferably, the aperture of the optical metrology tool is non-circular and, in step (c), the numerical aperture value NA of the optical metrology tool in the direction of the array edges is selected to be different from the numerical aperture value NA of the optical metrology tool in a direction normal to the array edges such that the array edges are resolved and individual elements within the array are not resolved.

A further aspect of the invention relates to metrology apparatus for determining bias or overlay error in a substrate formed by a lithographic process comprising a light source and an object plane adapted to receive a substrate having thereon a target for determining bias or overlay error in the substrate, the target having an array comprising a plurality of spaced, substantially parallel elements having a length and a width, the sum of the width of an element and the spacing of adjacent elements defining a pitch of the elements, edges of the elements being aligned along a line forming opposite array edges, the distance between array edges comprising the array width. An objective lens is provided between the light source and the object plane and is adapted to focus light from the light source onto a target on the substrate in one direction and focus reflected light containing an image of the target in an opposite direction. A camera is adapted to create a digital image of a target reflected from the object plane. There is further provided means for suppressing components of the digital image in the direction of the pitch of the elements, normal to the length of the elements and means for resolving the edges of the array and measuring the width of the array to determine bias or overlay error in the substrate. Preferably, the means for suppressing components of the digital image comprises a microprocessor adapted to perform a fast Fourier transform on the digital image to convert image intensity to a spatial frequency domain and a filter to suppress high spatial frequency components of the image in the direction of the pitch of the elements.

In a related aspect, the invention also provides a process for determining bias or overlay error in a substrate formed by a lithographic process comprising the steps of:

a) providing a target having an array of elements on a substrate, the array comprising a plurality of spaced, substantially parallel elements having a length and a width, the sum of the width of an element and the spacing of adjacent elements defining a pitch of the elements, edges of the elements being aligned along a line forming opposite array edges, the distance between array edges comprising the array width;

b) creating a digital image of the target;

c) suppressing components of the digital image in the direction of the pitch of the elements, normal to the length of the elements; and d) resolving the edges of the array and measuring the width of the array to determine bias or overlay error in the substrate.

Step (c) preferably comprises performing a fast Fourier transform on the digital image to convert image intensity to a spatial frequency domain and filtering out high spatial frequency components of the image in the direction of the pitch of the elements.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIGS. 1–6 illustrate top plan views of different target arrays useful in connection with the present invention.

FIG. 7 is a schematic of an optical metrology tool measuring a target array.

FIG. 8 is a top plan view of the target array shown in FIG. 7.

DESCRIPTION OF THE PREFERRED EMBODIMENT(S)

Figure 9:
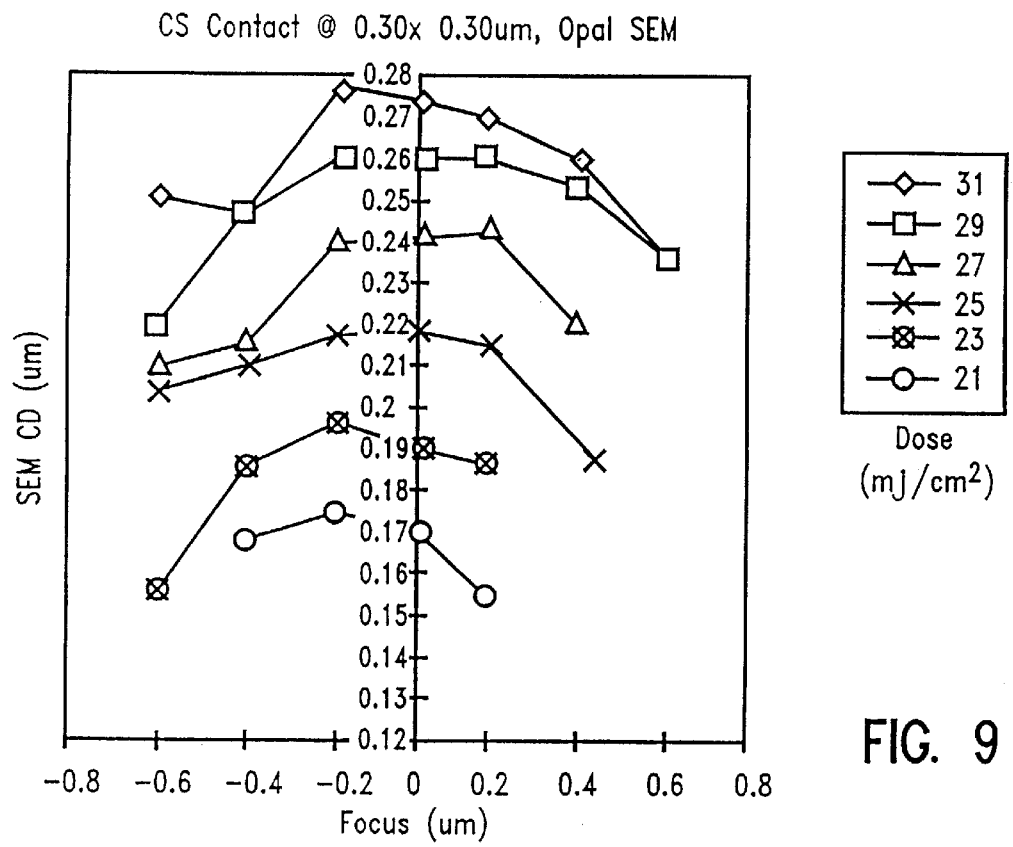
FIG. 9 is a graphical representation of SEM data on a single 0.3 μm contact (space) on a substrate through focus and exposure matrix.
Figure 10:
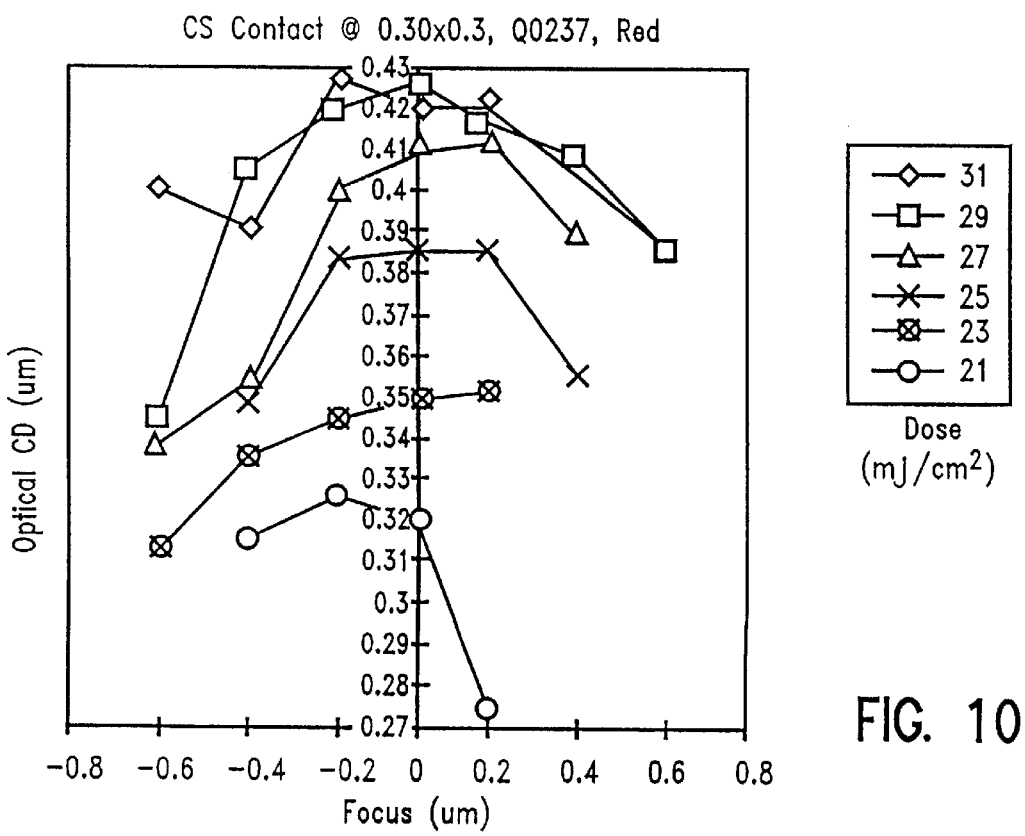
FIG. 10 is a graphical representation of optical array bias data in accordance with the method of the present invention through focus and exposure matrix.

In describing the preferred embodiment of the present invention, reference will be made herein to FIGS. 1–20 of the drawings in which like numerals refer to like features of the invention.

The methods and procedures for monitoring features during lithography by the phenomenon of "image shortening" as disclosed in U.S. application Ser. Nos. 08/359,797, 08/560,720 and 08/560,851 are hereby incorporated by reference.

Measurement of unresolved pattern arrays may be accomplished using unmodified optical metrology tools whose primary task is overlay measurement in order to improve accuracy and precision of unresolved patterns metrology. An optical metrology method may be applied to detect the edges of pattern arrays made up of discrete patterns of the type used in image shortening arrays, while the array elements themselves are not resolved by the metrology system. The array elements can be any shape or orientation as long as they are configured so that the element edges at the ends of rows define an array edge.

In a preferred embodiment, a novel metrology tool and system are disclosed, which system more preferably employs non-circular, adjustable apertures for varying the effective numerical aperture of the tool.

A series of different array patterns useful in connection with the method of the present invention are shown in FIGS. 1–6. In each example the elements have a length and a width, and are aligned in rows such that ends of the elements form the edges of the arrays. FIG. 1 illustrates a pair of array patterns useful in applications where line end shortening is used, as described in the aforementioned incorporated applications. The array patterns have elements 120 extending horizontally whose element spacing is equal to the element width, and whose element width is less than the element length. Each element is continuous across the array width, and the element ends form opposite edges of the arrays. Each array has a width less than the array length.

FIG. 2 illustrates a pair of array patterns having elements 122 extending vertically whose element spacing is again equal to the element width, and whose element width is again less than the element length. Each element is also continuous across the array width, and the element ends form opposite edges of the arrays. However, each array has a width (equal to the element length) greater than the array length. The array edges are 90° to the direction of the length of elements 122.

FIG. 3 illustrates a pair of array patterns made up of discontinuous, staggered elements 124 extending in vertical rows. Again, element spacing is equal to the element width, and element width is less than the element length. However, each element in a vertical row (in the direction of its length) is spaced from adjacent elements by the same spacing as that between rows. The rows of elements are staggered so that the spacing between elements in a row is not aligned perpendicular to the rows, but is at an angle less than 90° thereto. The ends of the elements at the ends of the rows form array edge 124a which is at an angle less than 90° to direction of the row of elements.

FIG. 4 illustrates a pair of array patterns having elements 125 whose element spacing is again equal to the element width, and whose element width is again less than the element length. However, elements 125 extend at an angle of 45° to the array edges. Each element is continuous along its length, and the element ends form opposite edges of the arrays. The array width $D_{array}$ is 1.414× element length.

FIG. 5 illustrates a pair of array patterns made up of discontinuous, elements 126 extending in vertical rows. Again, element spacing is equal to the element width, but in this example each element is square so that element width is equal to element length and each element in a vertical row is spaced from adjacent elements by the same spacing as that between rows. The elements are aligned both vertically and horizontally so that the array edges are 90° to the direction of the vertical row of elements 122, but the elements may also be staggered in rows as shown in FIG. 3. The elements of an array pattern such as that shown in FIG. 5 may be made up of functional features, for example, 0.3 $\mu$m diameter contacts, etched in a substrate, so that it would not be necessary to etch a separate target pattern into the substrate to check bias.

FIG. 6 illustrates a pair of array patterns made up of discontinuous, square elements 128 staggered in overlapping rows. Again, element spacing within a particular vertical row is equal to the element width, but each vertical row overlaps with an adjacent vertical row. The elements are aligned so that the element spacing between adjacent rows is less than 90° to the direction of the vertical row of elements.

The present invention is applicable to the control of all types of lithographic patterns, for example, lines, trenches, contacts and the like, where the array edge tracks the edge of individual elements with process variation. An important aspect of the present invention is the ability to modify the resolution of the optical metrology tool by way of wavelength of the light source and/or numerical aperture of the microscope in conjunction with the configuration of the pattern array, such that the individual elements of the array are not resolved and the edges of the array are resolved. The present invention requires no lower limit on the element dimensions. To achieve optimum measurement precision with smaller element dimensions, the resolution needs to be tuned such that the pitch of the array elements falls just below the inverse of the spatial frequency cutoff of the optical metrology system.

The spatial frequency cutoff ($F_c$) of an optical system is determined by its wavelength and numerical aperture, and the degree of coherence of its illumination. In general, $F_c$ is proportional to NA/wavelength and the minimum resolvable pitch $P_{min}$ is given by Equation 1:

$$P_{min} \approx \frac{\lambda}{NA(1+\sigma)} \quad (1)$$

where:
P is the sum of element width and element spacing in the target array
$\lambda$ is the wavelength being used by the optical tool
NA is the numerical aperture of the microscope objective
$\sigma$ is the partial coherence (or ratio of illumination NA to objective NA)

For example, if NA=0.5 σ=0.5 and wavelength=500 nm, $P_{min}$=670 nm. In this case, patterns having a pitch below 670 nm will be unresolved. A two-dimensional array of such structures would appear as a uniform change in intensity to the optical system over the area of the array, as compared to the background. Provided the array dimension ($D_{array}$) such as array width or array length is much greater than $P_{min}$ ($D_{array} \gg P_{min}$), $D_{array}$ is measurable in the optical system.

Even though the individual elements of the array are not resolved, the measurable array dimension $D_{array}$ will track the dimensional variation of the elements. Thus, the optical measurement of the array enables in-line control of the element dimension.

Figure 12:
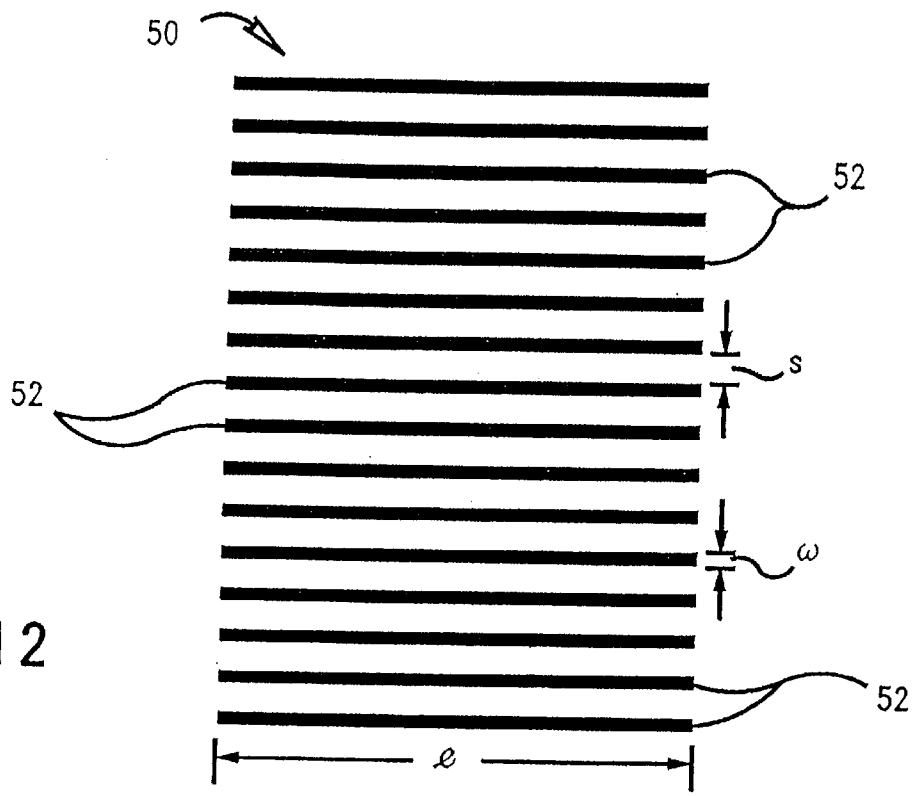
FIG. 12 is an embodiment of a line pattern shortening array useful in connection with the present invention.

In FIG. 7, an optical metrology tool comprises a light source 101, a beam splitter 103, a lens 105 and an image plane 107. The numerical aperture of Light beam 109 emitted from light source 101 has a wavelength λ. Beam splitter 103 comprises a partially transmitting mirror, such that a portion of the light intensity of beams 109 is reflected down as beam 111 through lens 105. Below lens 105 is a target array 113 (FIG. 8) comprising a plurality of elements 115 of width w and length l separated by spaces (troughs) of width s lithographically printed against a background substrate 100. Elements 115 can be continuous lines across the width of the array (equal to l), as shown in FIG. 12, or may be a series of discrete lines or dots extending across the array width. As shown in FIG. 12, w is equal to s, although in accordance with the method of the present invention w can also be greater than or less than s. The pitch of the elements P is equal to the sum of w and s. The values for w, s, NA, λ and σ are such that P is less than or equal to $\lambda / [NA(1+\sigma)]$.

After light beams 111 pass through lens 105 and are focused on target 113, the beams are diffracted as image beams 119, 121a and 121b. As a result of the selection of element pitch, numerical aperture and wavelength in accordance with the method of the present invention, the individual elements 115 are not resolved with respect to the spaces 117 between the elements. Reflected beam 119 of 0 (zero) order passes straight up through lens 105 and into beam splitter 103 whereupon half emerge as beams 123. Beams 121a and 121b, diffracted from target 113, are of +1 and −1 order, respectively, and are diffracted outside of the capture area of the optical metrology tool.

Beams 123 form image 125 on image plane 107. The width of the image is $D_{array}$, i.e., equal to the width of target 113. However, because of the selection of P, λ, NA and σ, the individual elements and spaces are not resolved, and the interior of image 125 appears as a gray area, leaving only the target array edges resolved against the background. The pitch may have a fixed value and the light source wavelength, numerical aperture and coherence may be selected, or the light source wavelength may have a fixed value and the pitch, numerical aperture and coherence may be selected, or the numerical aperture may have a fixed value, and the light source wavelength and pitch may be selected.

As contemplated in the method of the present invention, the target is always contrasted against the background of the substrate. A microscope having control of these parameters (NA, λ, σ) is useful for measuring unresolved patterns, since the microscope can be tuned so that the array is just barely unresolved. Changing light source wavelength may introduce pattern contrast problems and decreasing σ may introduce edge ringing and other less desirable coherence issues. As such, it is preferred that the microscope parameter controlled is the numerical aperture value, NA, as may be controlled by a variable diameter pupil or iris.

Optionally to what is described in FIG. 7, a darkfield application of the optical metrology system will also be operable. Furthermore, other imaging approaches as can be envisioned with desirable asymmetric properties for measuring unresolved patterns. For example, confocal microscopes can be constructed with elliptical or rectangular spot shapes (rather than the usual circular spot shape) which can be oriented appropriately to the pattern under test. Also, a scatterometer which collects light scattered horizontally separately from light scattered vertically may be utilized for any desired array pattern to be measured. Every repeating pattern will have a Fourier spectrum which describes what angles light will scatter from the pattern. By collecting at these known scattering angles, through spatial filters, one can distinguish the areas containing the periodic pattern from those not containing the pattern with high resolution.

EXAMPLE 1

A substrate having a lithographically printed contact hole of 300 nm size has been controlled using the method of the present invention. An array of 300 nm diameter contacts having a 600 nm pitch was measured through a focus-exposure matrix. For example, as shown in FIG. 5, $D_{array}$ as shown equals (5×w)+(4×s), and is considerably greater than P. While l is greater than $D_{array}$ as seen in FIG. 8, l may also be equal to or less than $D_{array}$. The array dimension variation, as measured on a Biorad Optical Metrology Tool and shown in FIG. 10, correlated to that of the individual contacts, as measured on an Opal SEM and shown in FIG. 9. The measurement capability was shown to be a sensitive function of the optical resolution, since improved measurement capability was observed at lower, rather than higher, resolution. Best performance was observed using the red filter to achieve a 575–625 nm light wavelength, a numerical aperture of 0.7 and partial coherence of 0.5, such that individual contacts were unresolved.

Figure 11:
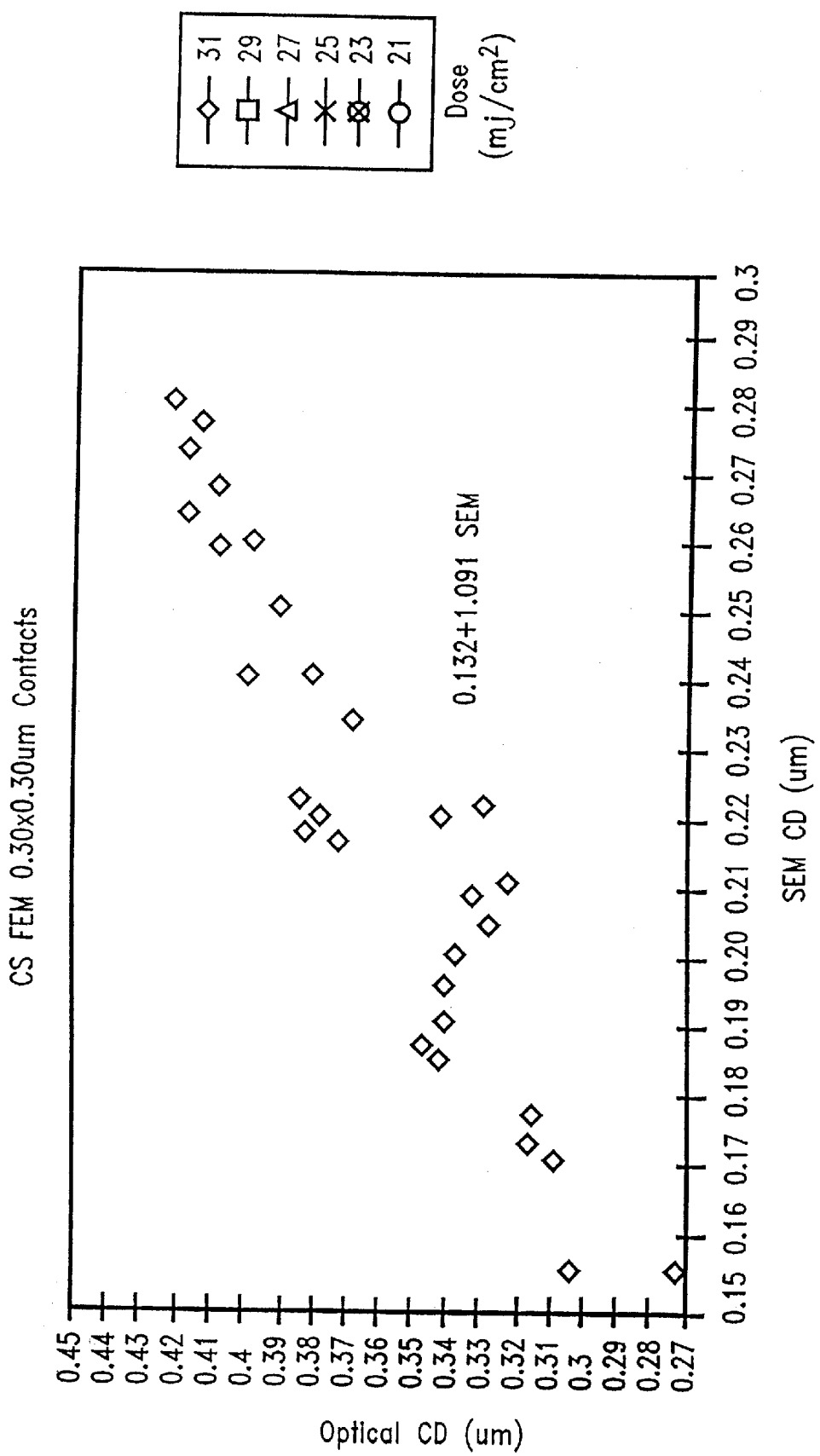
FIG. 11 is a graphical representation of correlation between SEM and optical array bias data showing 90% agreement over focus and exposure matrix.

The sensitivity and precision of the measurement technique of the present invention appears to be equal to or better than that of current SEMs due to the inherent averaging over many elements and the good focus repeatability of the Biorad system. Specifically, the sensitivity to dose/focus variation is illustrated in FIG. 11, which shows a plot of the array dimension versus the SEM critical dimension over the range of conditions used in the measurements shown in FIGS. 9 and 10. The best fit slope is approximately 1, indicating comparable sensitivity. Furthermore, the repeatability of the individual optical measurements is less than 7.5 nm (3σ), as compared to SEM repeatability greater than 10 nm (3σ). Accuracy of the present system may be checked by calibration to SEM cross-section and/or AFM profiles. Such calibration is anticipated to be infrequent due to the demonstrable stability of the optical metrology tool.

The contact hole array used in Example 1 places the most severe constraint on the optical resolution because the array pitch is equal along the length and width of the array. Even under this condition the precision of the optical measurement of the array width is superior to the SEM measurement of the individual contact. In instances where the pitch of the array patterns differs in different directions, the metrology optics can be further optimized for the particular pattern being used by using spatial filter techniques.

Figure 13:
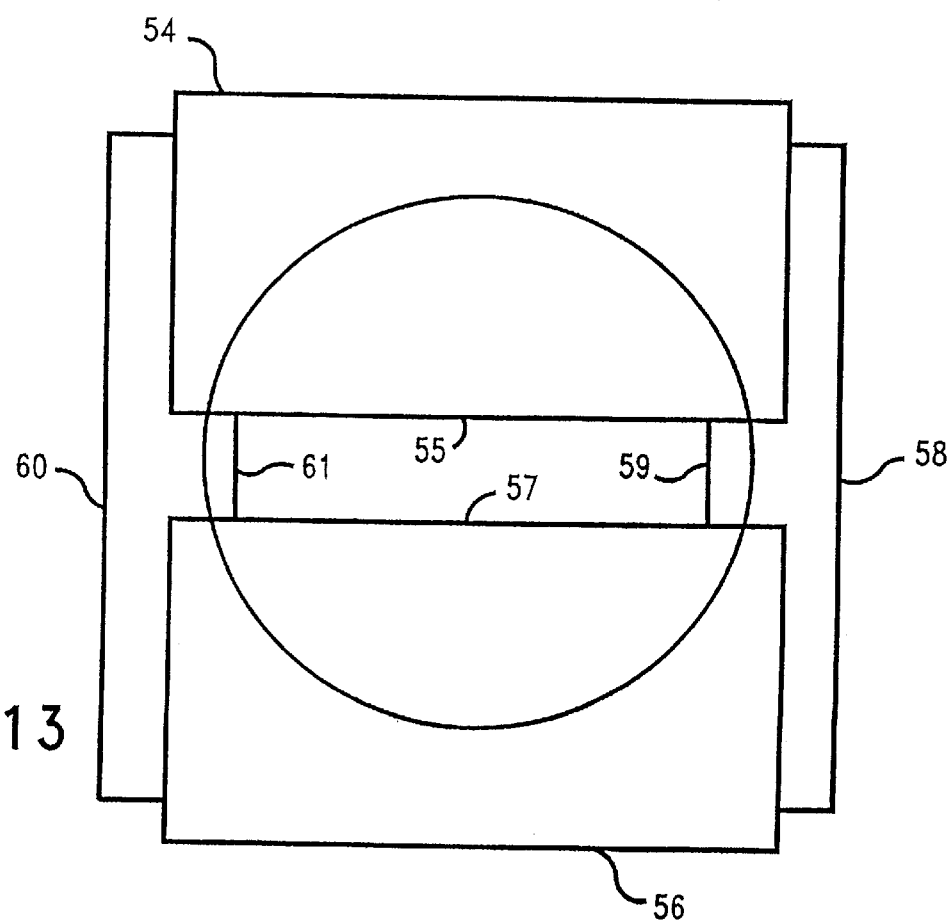
FIG. 13 is a top plan view of a non-circular pupil aperture which may be adjusted to provide different numerical aperture values in the vertical and horizontal directions.

One spatial filter method is the use of a noncircular pupil aperture, e.g., a rectangular or elliptical shape. By this method, the optical resolution can be made low in one direction, so as not to resolve the pattern, and high in another direction, so as to make a sharp measurement. In the specific example of the line-shortening pattern shown in FIG. 12, it is desirable to have less resolution in the vertical direction, so as not to resolve the individual lines, while simultaneously having higher resolution in the horizontal direction, so as to make a precise measurement of the line length. This may be achieved by use of a non-circular aperture having a variable aperture in both horizontal and vertical directions. One preferred embodiment of this approach would consist of a four (4) bladed programmable aperture at the Fourier plane of the microscope objective, as shown in FIG. 13. Blades 54, 56 are movable toward and away from each other in the vertical direction and have inner pupil edges, 55, 57, respectively. Blades 58, 60 are movable toward and away from each other in the horizontal direction and have inner pupil edges 59, 61, respectively. Inner edges 55, 57, 59, 61 define the pupil of the microscope objective. By moving these 4 blades, different rectangular apertures can be defined which can be optimized to the known array patterns to be measured. Any other configuration of a non-circular aperture filter may be used.

EXAMPLE 2

Figure 14:
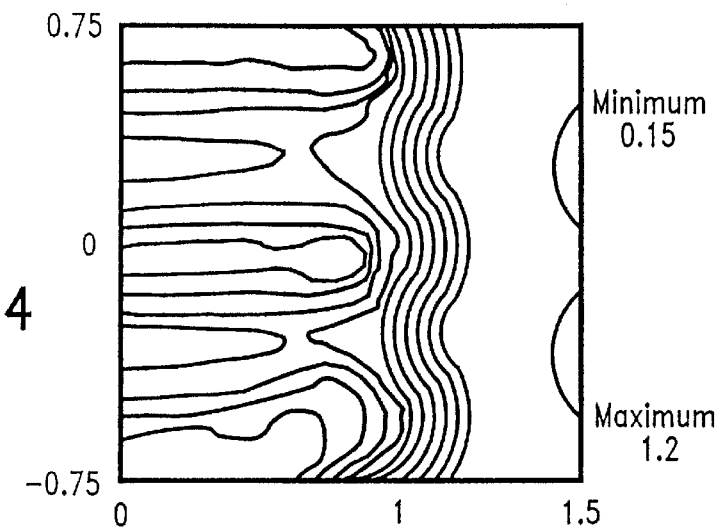
FIG. 14 shows the image contours of a simulation of an array pattern in which individual elements in the array have been resolved by the optical metrology tool.
Figure 15:
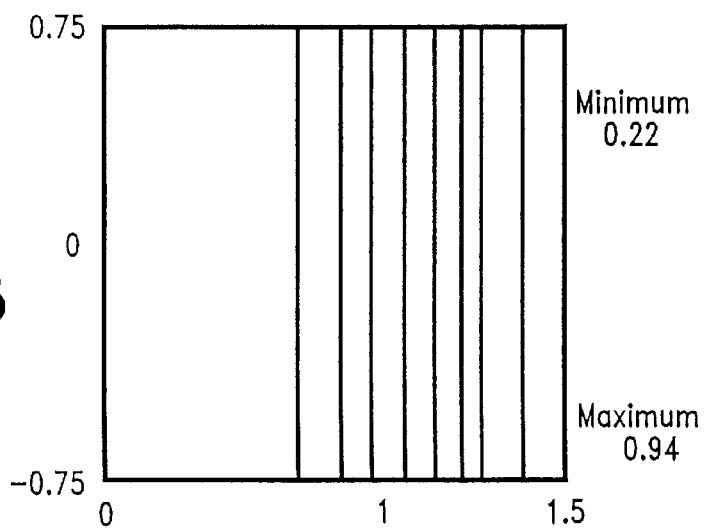
FIG. 15 shows the image contours of a simulation of an array pattern in which individual elements in the array have not been resolved by the optical metrology tool.
Figure 16:
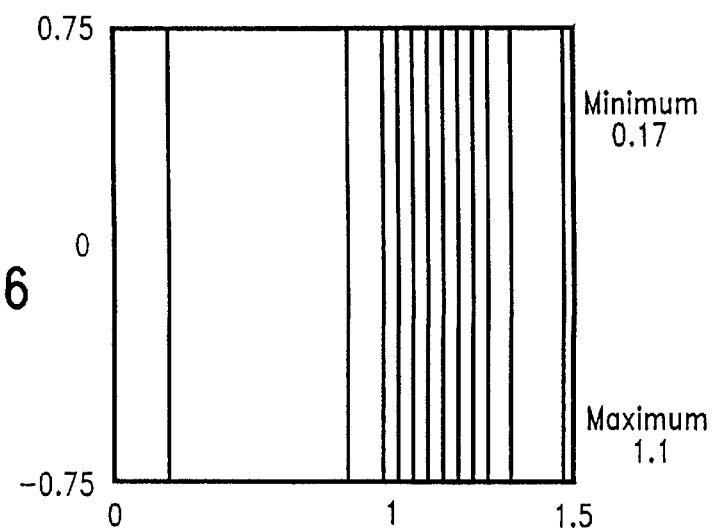
FIG. 16 shows the image contours of a simulation of an array pattern in which individual elements in the array have not been resolved by the optical metrology tool while the edges of the array have been resolved.

Simulations have been performed to confirm the advantages of the above approach for the line-shortening pattern of FIG. 12, in which the array 50 consists of a number of lines or elements 52 which have a width w of 350 nm, a length l of 2 microns, and spacing s between elements of 350 nm. The width of the array equals the length l, i.e., 2 microns. The ends of elements 52 form the array edges. The length of the array equals the number of elements, 16, times the element width, 350 nm, plus the number of spaces, 15, times the spacing, 350 nm, or 10.85 microns. Image simulations have been made for this array pattern for three different imaging situations, with the image contours shown in FIGS. 14–16. FIG. 14 shows a normal high resolution objective with a circular NA=0.7 with λ=500 nm and a σ=0.5. The edge of the line-shortening pattern shows distinctive ripples, due to the individual lines being resolved, which makes more difficult the task of measuring the line length. FIG. 15 shows a normal low resolution objective, with a 0.37 NA objective and σ=0.95. The individual horizontal lines are now completely unresolved. In this figure, the image profile slope is somewhat degraded, as can be seen by the relatively wide spacing of the contour lines. FIG. 16 shows contours using a rectangular pupil filter similar to FIG. 13, where the horizontal NA is 0.7 and the vertical NA has been reduced to 0.37, as may be achieved by use of a non-circular pupil. Again, the individual lines are completely unresolved. However, the image slope has increased by about a factor of two in the measurement direction. Thus, utilizing a non-circular pupil with selectively different numerical aperture values in horizontal and vertical directions provides for the desired resolution of array edges, without resolution of the individual array elements.

Figure 17:
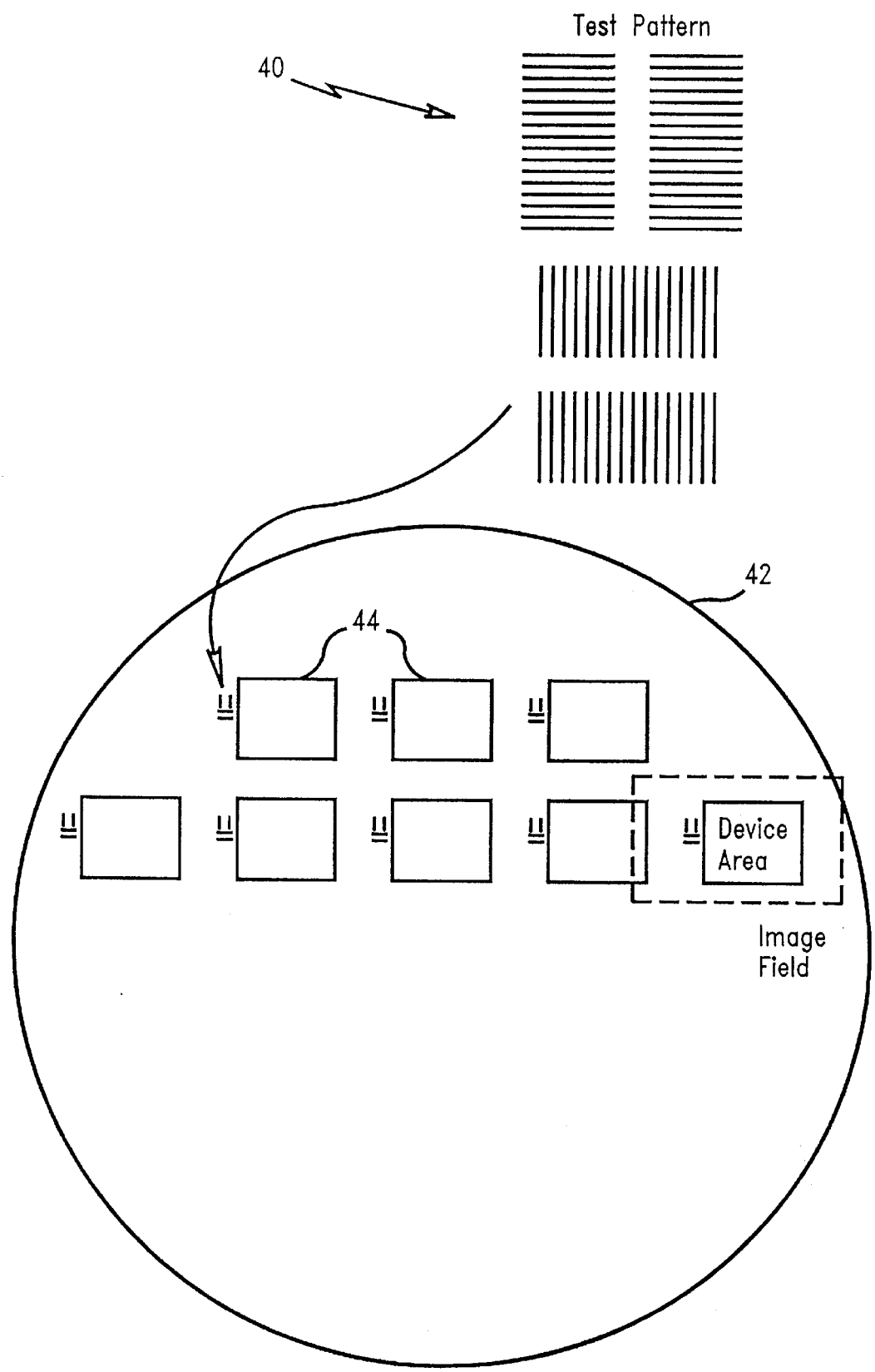
FIG. 17 is a top plan view of implementation of a test pattern on a product wafer.

Referring now to FIG. 17, for product monitoring and control, any of the array patterns useful in the present invention, for example, test pattern 40, may be printed in conjunction with the desired device pattern on the product wafer 42. To represent the product, the elements of the test pattern 40 should have a width and pitch smaller than or equal to (corresponding to) that of the most critical feature of the device pattern. Depending on the application, test pattern 40 can contain a plurality of array lines, the minimum width and space of the arrays can be varied to cover a range of dimensions below and above the intended design minimum features or the minimum capability of the lithographic process and tool. At a minimum, at least one array of lines will constitute the test pattern. As shown in FIG. 17, test patterns 40 can be distributed over any areas not occupied by the product patterns 44 and/or other requisite alignment and measurement patterns. Optionally, when resist/etch image characterization is the objective, similar test patterns of varying line width and patch can be distributed throughout the image field and wafer.

Figure 18:
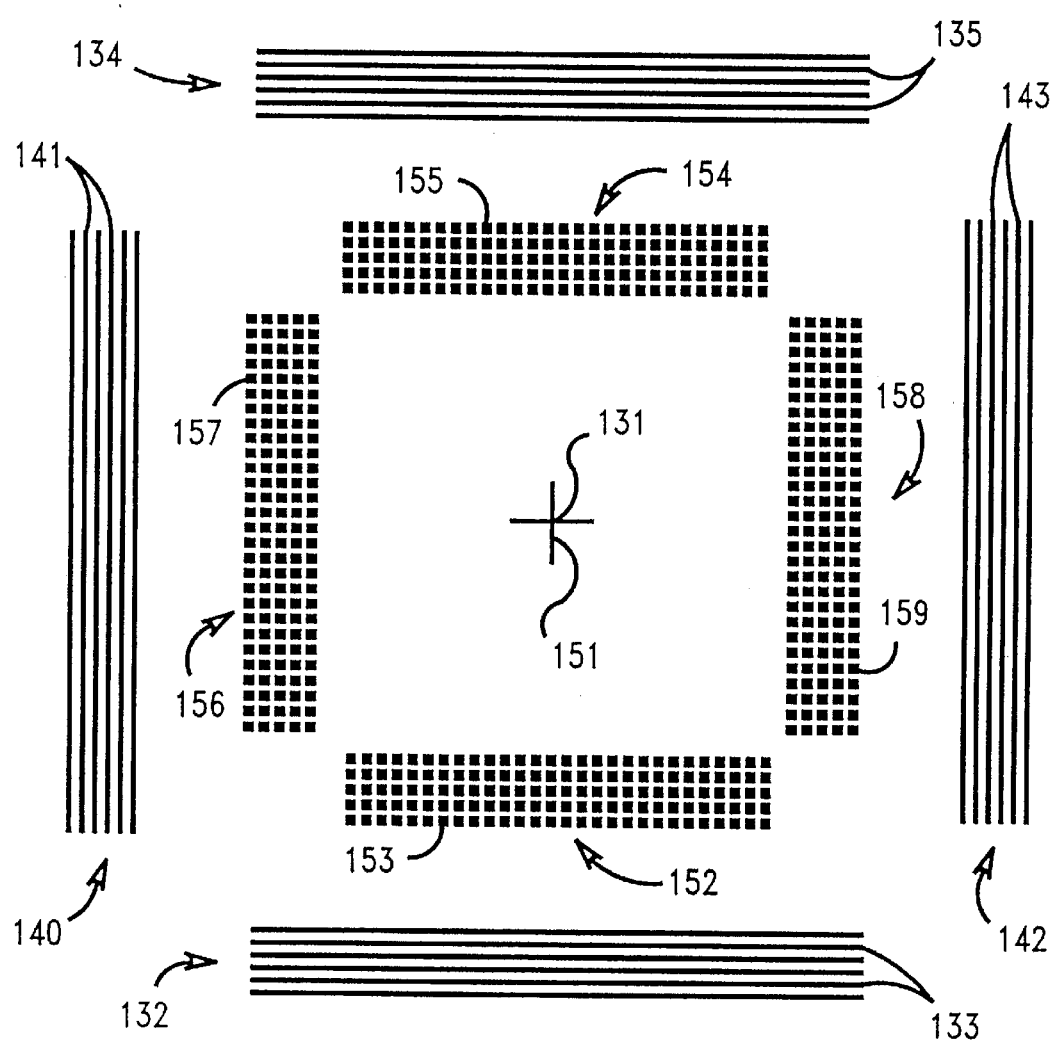
FIG. 18 is a top plan view of an embodiment of overlay target arrays useful in connection with the present invention.

An embodiment of an overlay target made up of level specific arrays is depicted in FIG. 18. A first target portion on one level of a substrate is shown comprised of arrays 132 and 134 oriented with elements 133, 135, respectively in the X direction (elements lengths parallel to the X-axis) and arrays 140 and 142 oriented with elements 141, 143, respectively in the Y direction (elements lengths parallel to the Y-axis). Element spacing is equal to element width in arrays 132, 134, 140 and 142. Opposite arrays are equidistant from target center point 131. Array pairs comprise separate targets wherein the nominal distance between facing edges of the array pairs (on the mask or reticle) is a predetermined, selected value. Likewise, array pairs 140, 142 also comprise separate targets arranged in a like manner.

A second target portion printed on another level of a substrate is comprised of arrays 152, 154, 156 and 158 having discrete, square elements 153, 155, 157 and 159, respectively, aligned in rows parallel to the X- and Y-axes. Opposite arrays are equidistant from target center point 151. Element spacing is equal to element width in arrays 152, 154, 156 and 158.

To determine edge overlay, the image of target arrays 132, 134, 140 and 142 is exposed and etched on one level of a substrate and the image of target arrays 152, 154, 156 and 158 is exposed and etched on a different level of the substrate such that the center points 131, 151 of the target portions are coincident and the X and Y orientation of the respective element lengths are preserved. The bias and overlay error may be calculated for the X and Y directions by measurement of distances between edges within an array, or between arrays on the same or different levels. Measurements may be made during processing to check both exposure and development of the desired device pattern and subsequent etching of the pattern into the wafer substrate. The target depicted in FIG. 18 may also be used as a direct replacement for a conventional box-in-box target employed in the prior art.

The improved in-line metrology tool of the present invention uses the self-consistent design of a target and imaging system to transcend the limitations of optical microscopy. The target employs measurement of array edges instead of individual pattern elements, as discussed above.

Figure 19:
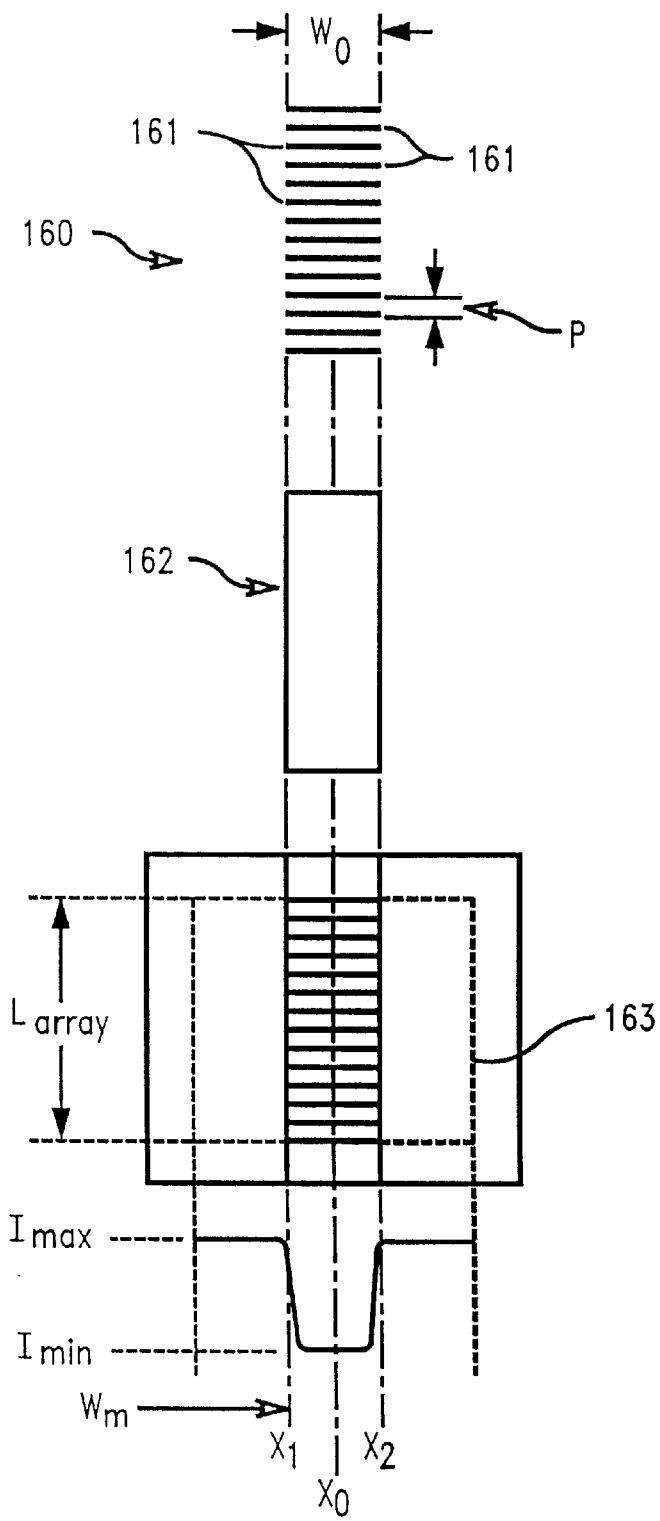
FIG. 19 is a schematic view of a method of measuring target width without resolving individual target elements in accordance with the present invention.

As shown schematically in FIG. 19, target 160 on a substrate wafer consists of an array of parallel pattern elements or lines 161 of length at pitch P. The pitch is matched to the minimum pitch in the chip design for a specific masking layer. The array width, $W_o$, is large relative to the minimum resolution of the metrology tool. For the particular pattern design shown, $W_o$ also corresponds to the length of the individual pattern elements. If P is below the optical resolution, wherein $$P < \lambda/NA(1+\sigma) \qquad (2)$$

then the optical image of the array will be a featureless wide line 162 as shown, wherein the pattern elements are unresolved in the direction of the pitch, but well resolved in the direction of the array width. Using optical microscopy, the image of line 162 may be brought into focus and captured on a CCD camera. An average intensity trace is collected along a length of line 162 in the camera's field of view. The measurement gate 163 may be set to average over many pixels along the length $L_{array}$ of the array. The average detected intensity along the length of line intercepted by the measurement gate is shown in the unpatterned regions as $I_{max}$, while the detected intensity within line 162 is shown as $I_{min}$. Contrast C at each edge is given by:

$$C = (I_{max} - I_{min})/(I_{max} + I_{min}) \quad (3)$$

Edge detection may be conducted by applying algorithms by a variety of well-known techniques to determine the measured width of the array, $W_m$, which is determined by the equation:

$$W_m = X_1 - X_2 \quad (4)$$

The array center $X_c$ is given as $$X_c = (X_1 + X_2)/2 \quad (5)$$

As noted above, it is important that the measured width vary consistently with the actual width over a range of process conditions about the nominal operating point.

The issue of false sensitivity can be addressed, in part, by monitoring the characteristics of the average intensity trace in FIG. 19. In particular, the image contrast defined in equation 3 is a sensitive indicator of changes in the optical properties of the substrate and/or patterned layer. Statistical process control methodology may be applied to the contrast to determine whether or not a particular measurement was suspected of false sensitivity; namely, a perceived change in CD due to variation in the optical image unrelated to the actual pattern dimensions. In this manner, a "weakness" of optical metrology approach could be turned to an advantage, by providing additional insight into potentially harmful process variation.

A consequence of using the target design shown in FIG. 19, in which the minimum pitch is perpendicular to the measurement direction, is that the length of minimum dimension patterns is monitored, rather than their width. Line lengths tend to be significantly more sensitive to process conditions than line widths as the resolution limits of any given lithography process are approached.

An added benefit to having the target pitch perpendicular to the measurement direction is that it alleviates the need to satisfy Equation 1, namely, to keep the pitch below the optical microscope resolution. The result of partially or even fully resolving the pattern elements is that the pixels along the edge of the array see a modulation in the edge position. However, on average over a long length of the array this still results in a single edge position sensitive primarily to the length of the individual lines. Nonetheless, the edge acuity of the detected intensity is decreased when the lines are resolved, thus degrading the precision of the measurement. To optimize this metrology approach for semiconductor manufacturing applications, the configuration of the improved optical microscope of the present invention preferably insures that Equation 1 is met for the targets employed, such as those described above.

The target configurations can be tailored to mimic pattern layers in the manufacturing process (e.g., lines, contacts or islands), to increase the sensitivity of metrology (e.g., using tapered lines, daggers or sub-resolution patterns), and to characterize specific attributes of the lithographic process (e.g., linearity, and proximity bias).

To maintain an operating point for pattern layers in manufacturing with a minimum of effort, it is preferred to select a single design whose response to process variation can be correlated to the characteristics of each layer. Based on extensive evaluation, the simple design shown in FIG. 1, where P is matched to the minimum pitch of the particular layer, appears to be the best compromise.

Figure 20:
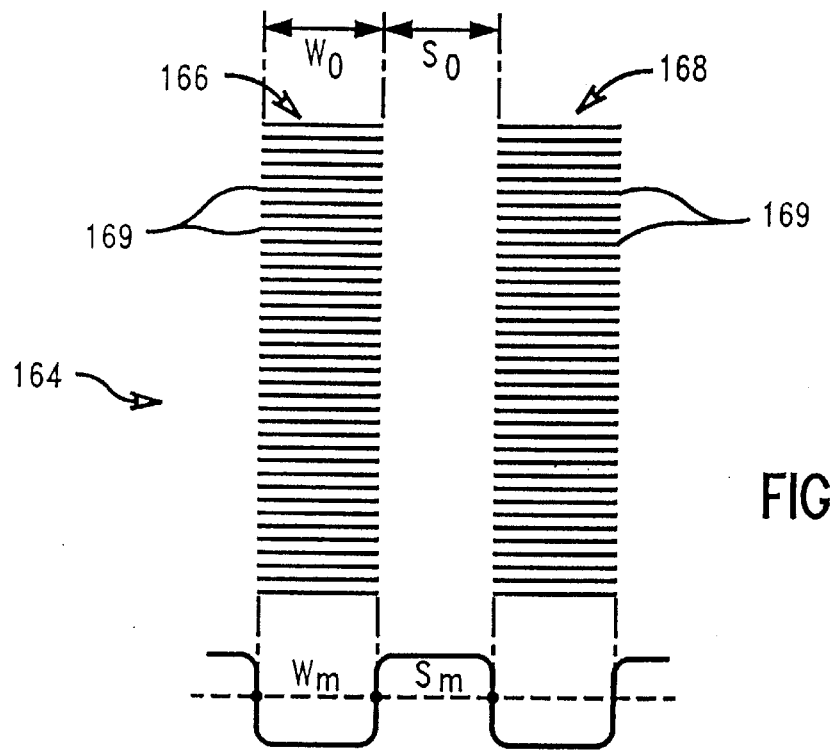
FIG. 20 is a plan view of one embodiment of a target on a substrate for use in accordance with the present invention.
Figure 21:
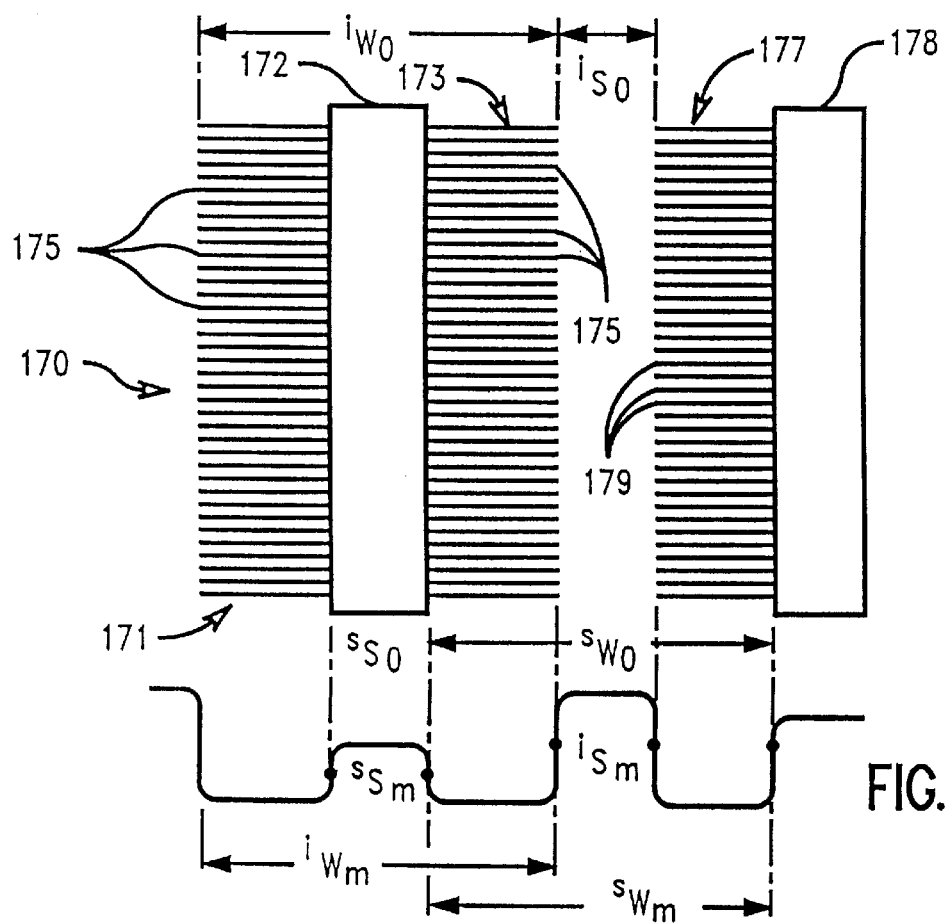
FIG. 21 is a plan view of another embodiment of a target on a substrate for use in accordance with the present invention.

Two improvements add greatly to its capability to this basic target configuration are depicted in FIGS. 20 and 21. A first improvement is shown in FIG. 20, where target 164 comprises a pair of neighboring arrays 166, 168 of equilength parallel lines or elements 169. Line length and array width is given as $W_o$, while array spacing or separation is given as $S_o$. A unique array pitch, $P_o = W_o + S_o$, is established which is invariant to process conditions. The CD measurement can now be expressed as a bias $B_m$ between the measured values of the array width $W_m$ and the array separation $S_m$:

$$B_m = W_m - S_m \quad (6)$$

When comprised of two independent measurements ($W_m$, $S_m$), the precision of $B_m$ is improved by the square root of 2 over that of $W_m$. The difference between the measured pitch and the nominal pitch can be used as a means to monitor the precision $\epsilon$ of each determination of the bias:

$$\epsilon = P_m - P_o \quad (7)$$

where limits can be set on $\epsilon$ to indicate bad measurements. Furthermore, a unique value of $P_o$ can be assigned to each target as an encoded identifier.

A second target improvement is the use of tone reversing arrays, as described in U.S. application Ser. No. 08/919,998 entitled Metrology Method Using Tone Reversed Pattern, U.S. application Ser. No. 08/921,986 entitled Feature Size Control System Using Tone Reversing Patterns, and U.S. application Ser. No. 08/929,341 entitled Optically Measurable Serpentine Edge Tone Reversed Targets, all filed on even date herewith. The patterns or elements of such target may comprise resist shapes, islands or lines which are areas raised above an adjacent area, or spaces or contacts which are areas depressed below an adjacent area. As used herein and in the aforementioned applications, the terms shape, island and line have equivalent meaning, and the terms space trench and trough have equivalent meaning. Contact refers to the case where the dimensions of the space are approximately equal in X and Y directions.

The target elements illustrated above have only a single tone, namely, they are comprised of either spaces or islands in the patterned film. An example of a tone reversing array or pattern that contains array edges of both tones is shown in FIG. 21. Target 170 comprises a pair of arrays 171, 173 of equilength parallel lines 175 in contact with and on opposite sides of island 172 of the same length, width and tone as arrays 171, 173. The width of arrays 171, 173 and island 172 is given by $^iW_o$. Spaced from array 173 by a distance $^iS_o$ is array 177, comprising equilength parallel lines 179, in contact along an array edge with island 178 of similar length and width.

The expression of bias and pitch as a function of the island and space edge locations enables the separation of CD response to exposure dose and/or etch time from CD response to other process variables, such as focus, film thicknesses, and substrate properties.

For example, an island-to-space bias $_{is}B_m$ and pitches $^pW_m$, $^pS_m$ can be determined by the following equations:

$$^{is}B_m = {^iW_m} - {^sW_{m3}} = {^sS_m} - {^iS_m} \quad (8)$$

$$^pW_m = {^iW_m} + {^sW_m} \quad (9)$$

$$^PS_m = {}^{i}S_m + {}^{s}S_m \tag{10}$$

Since the island and space edges move in opposite directions with exposure dose, but in the same direction with defocus, $^{is}B_m$ is primarily sensitive to dose and insensitive to defocus, and pitches $^PW_m$, $^PS_m$ are primarily sensitive to defocus and insensitive to dose. The ability to distinguish dose and defocus dependence of CD is a key attribute of the tone reversal target.

If the island and space patterns have similar contrast when imaged in an optical microscope (for example, they are both dark with respect to the surrounding background), then changes to the perceived edge location with substrate properties will affect them approximately equally. Consequently, the dose dependent $^{is}B_m$, expressed as a difference between the two pattern widths, will be relatively insensitive to variations in the optical properties of the substrate. Because dose is the principal control parameter for CD, the ability to suppress false sensitivity to substrate properties is a second key attribute of the tone reversal target.

Figure 22:
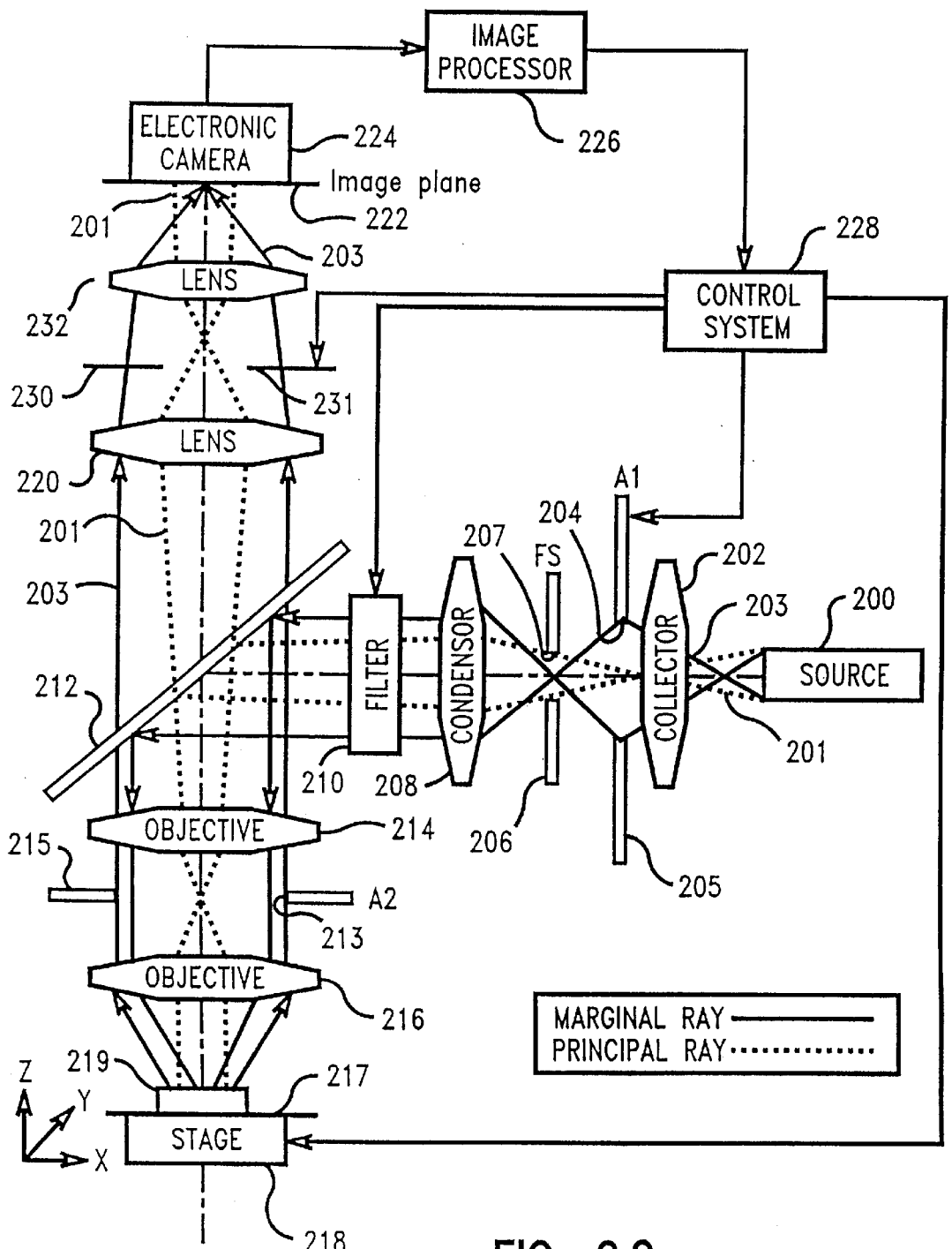
FIG. 22 is a schematic of the preferred optical metrology tool and system of the present invention.

The preferred metrology tool and system is depicted in schematic form in FIG. 22. The example shown is of a bright-field optical microscope system, although other optical configurations are contemplated in accordance with the present invention, such as, dark-field, phase-contrast, and diffraction-based systems akin to those commonly found in lithography tool alignment systems.

Bright-field optical metrology is applied to the measurement of both critical dimension and overlay in the semiconductor manufacturing process. In FIG. 22, a broadband light source 200 projects light from an illumination system onto a substrate 219 in object plane 217 of an objective lens 216. The illumination comprises principal rays 201 and marginal rays 203 which pass from source 200 through collector lens 202. An aperture 204 positioned in a plane 205 conjugate to the exit pupil of the objective lens 214, 216 determines the partial coherence of the illumination. A field stop opening 207, positioned in a plane 206 conjugate to the object plane determines the area illuminated on the substrate. After passing through condensor lens 208, the light rays 201, 203 enter wavelength filter 210 which selectively transmits a subset of the band of wavelengths emitted by source 200.

A partially reflective beam splitter mirror 212 redirects the illumination rays at a 90 degree angle into the microscope objective lens. The objective lens typically consists of multiple lens elements, shown schematically in FIG. 22 as a pair of lenses 214, 216. In most cases, the pupil plane 215 will be internal to the lens, as shown. The partial coherence of the optical system is normally determined by the degree to which the illumination fills the aperture 213 in pupil plane 215. The greater the area filled, the less coherent the illumination. Aperture 213 also determines the maximum angle of the diffracted rays collected by the objective and, hence, the resolving power of the objective.

After being reflected from substrate 219 on object plane 217 on movable stage 218, the collected image is passed back through objective lenses 216, 214, straight through beam splitter 212 and is projected onto electronic camera 224, typically a CCD array located in image plane 222. Normally, a single lens 224 would be sufficient to focus the image onto the CCD array on plane 222. As will be explained further below, a preferred embodiment of the present invention utilizes a second lens 232, between lens 220 and plane 222, and aperture 231 in plane 230 between lens 220 and lens 232. The output from camera 224 may be electronically filtered and analyzed by image processor 226. In the optical metrology system of the present invention, the various functions of the microscope, namely, image focus, aperture settings, filter selection, illumination level, etc., are managed by a central microprocessor control system 228.

Figure 23:
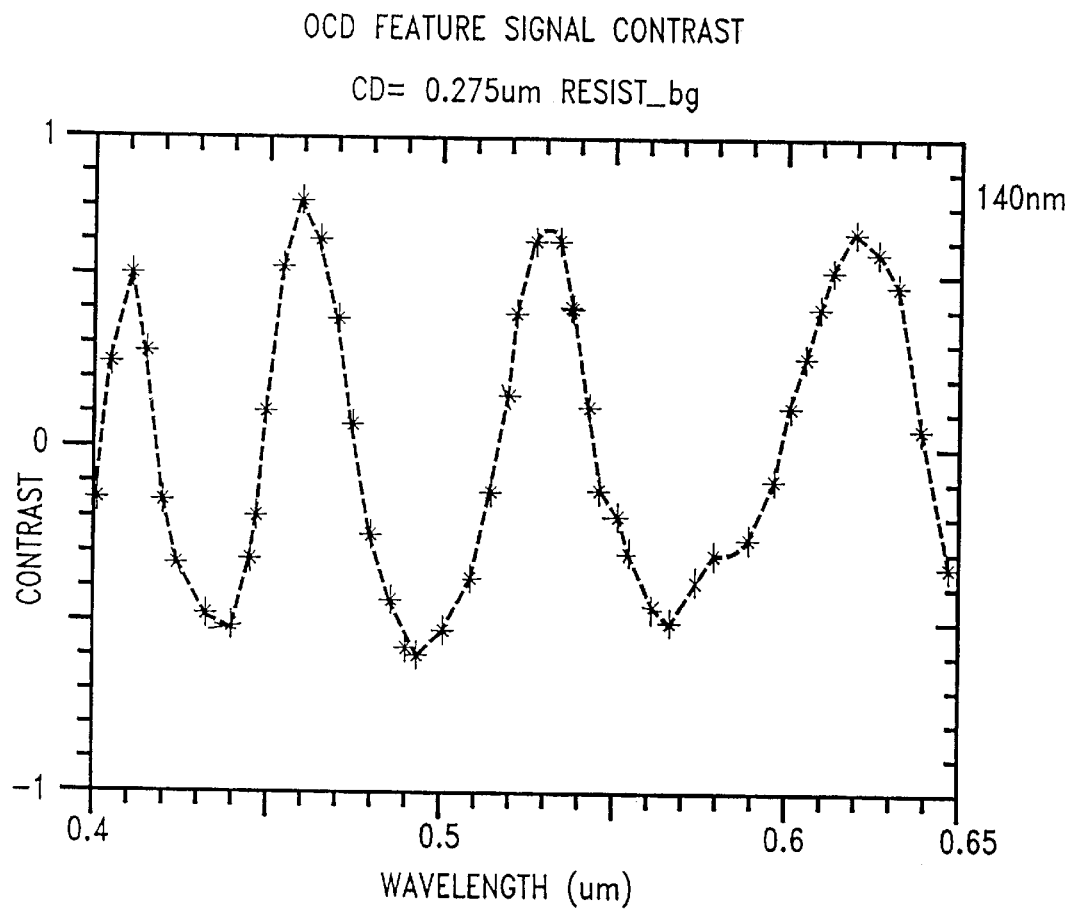
FIG. 23 is a graph of a simulation of the contrast of a target with a particular pitch as detected by a modification of the optical system depicted in FIG. 22.

The preferred target may be specified by its internal pitch, P, and by its array width W. There should be adequate image contrast between the target and its surrounding area. Image contrast is a function of the wavelength and partial coherence tool parameters, and the optical properties of the patterned target, the adjacent unpatterned area and the underlying substrate. FIG. 23 shows a graph of a simulation of the contrast of P=0.55 um grating structure in photoresist on a representative film stack as detected by NA=0.5 and $\sigma$=0.5 optical system. As shown, the contrast has a strong dependence on wavelength throughout the visible regime. At different wavelengths, the patterned area can be brighter or darker than the surrounding area, and the bandwidth of the high contrast regions tends to be on the order of 25–50 nm. In the case depicted, the contrast is determined principally by the relative reflectivity of the target and its surroundings.

The second tool parameter contributing to contrast is the partial coherence of the illumination. Incoherent systems see only changes in reflected intensity, whereas coherent systems are sensitive to phase as well. In cases where there is little intensity contrast, all of the signal is contained in the phase variations. Consequently, both wavelength and partial coherence selection may be utilized to optimize contrast. One constraint on their adjustment is that the illumination level in the object plane be sufficient to focus on and image the target.

In a preferred aspect of the present invention, wavelength $\lambda$ and partial coherence $\sigma$ are utilized primarily to contrast optimization. As such NA may be utilized to vary resolution. When the choice of $(\lambda, \sigma)$ is such that diffraction can occur as shown in Equation 11:

$$P > \lambda/(1+\sigma) \tag{11}$$

then the NA can be reduced according to Equation 1 to ensure that the pattern elements are not resolved. For example, when Equation 11 is not satisfied, there is no possibility of imaging the pattern elements in the array target of FIG. 1.

When P is perpendicular to the array width, as is the case in FIGS. 1 and 12, it is advantageous to set NA differently in the two orientations. A low NA in the direction of the pitch (perpendicular to the length of the individual elements) ensures that the pattern elements are not resolved, while a high NA in the direction of the array width (parallel to the length of the individual elements) ensures that the array edges are well resolved. One limitation on the high NA orientation is that it sets tighter constraints on the metrology focusing system. The focusing capability and NA must be consistent with the achievement of good measurement precision. At a minimum the precision is preferably equivalent to that achievable on current topdown SEMs, namely, 10 nm(3$\sigma$).

For the microscope design of FIG. 22, the NA may be adjusted by changing aperture 213 located in pupil plane 215. The NA could be varied continuously by making aperture 213 adjustable or variable. A rectangular aperture, such as that depicted in FIG. 13, would satisfy the need to adjust NA differently in two orthogonal directions corresponding to the pattern layout. However, it has been found to be difficult to vary aperture 213 without also affecting the illumination level and partial coherence. In a conventional objective lens, there is usually insufficient space at the pupil plane to insert the mechanical controls necessary to adjust the aperture. One alternative is to have a set of interchangeable objective lenses with fixed apertures. A preferred solution, which allows continuous variation of NA, is shown in FIG. 22 in a modification to the imaging arm of the microscope. An optical system is inserted in the path between objective 220 and image plane 222 to create a conjugate to the objective pupil plane. Conjugate plane 230 between lens 220 and lens 232 accept a variable aperture 231 whose opening may now be varied to determine the effective NA of the imaging system. Variable aperture 232 may be any of the variable apertures discussed above, and is preferably the rectangular variable aperture shown in FIG. 13.

Instead of, or in addition to, the configurations discussed above, the adjustment of effective resolution on the two orthogonal axes can be accomplished using otherwise well-known computational spatial filtering techniques in the image processor prior to edge detection. A fast Fourier transform (FFT) of the digital image acquired by the electronic camera converts the image intensity to the spatial frequency domain. Spatial filtering of the high frequency components of the image can be conducted independently in one or both dimensions. An inverse FFT converts the image back to the image intensity domain, where standard edge detection methods can be applied. If the image is acquired at high NA, and the filtering is such that high spatial frequency components in the pitch direction are suppressed, equivalent to satisfying Equation 1, then the intensity profile at edge detection will match the one generated using the equivalent rectangular aperture 213 or aperture 231 settings. Differences will arise in the case of coherent imaging, where the image is sensitive to phase variations, since the image processor only "sees" the image via its detected intensity. While these differences may not be significant, the computation required with each measurement by the image processing approach would add to the measurement time.

The optical system in the imaging arm of the microscope also establishes the image plane field-of-view (FOV) which is the image field size at the electronic camera. A typical FOV is 50 um square on a 512×512 CCD array. Consequently, the size of an individual pixel is approximately 100 nm square. The achievement of a precision of 10 nm requires interpolation of the edge position of the optical image to significantly better than 0.1 pixel. Improved precision can be achieved at the same FOV by using a denser CCD array, or by decreasing the FOV (magnifying the image) at the same CCD density. The other major contributors to precision are the image acuity along the array edge and its repeatability. As noted above, at a given wavelength, the image acuity and repeatability are interrelated by the focusing repeatability. If focus repeatability is not an issue, the precision can be improved by operating at a high NA in the array width direction.

Figure 24:
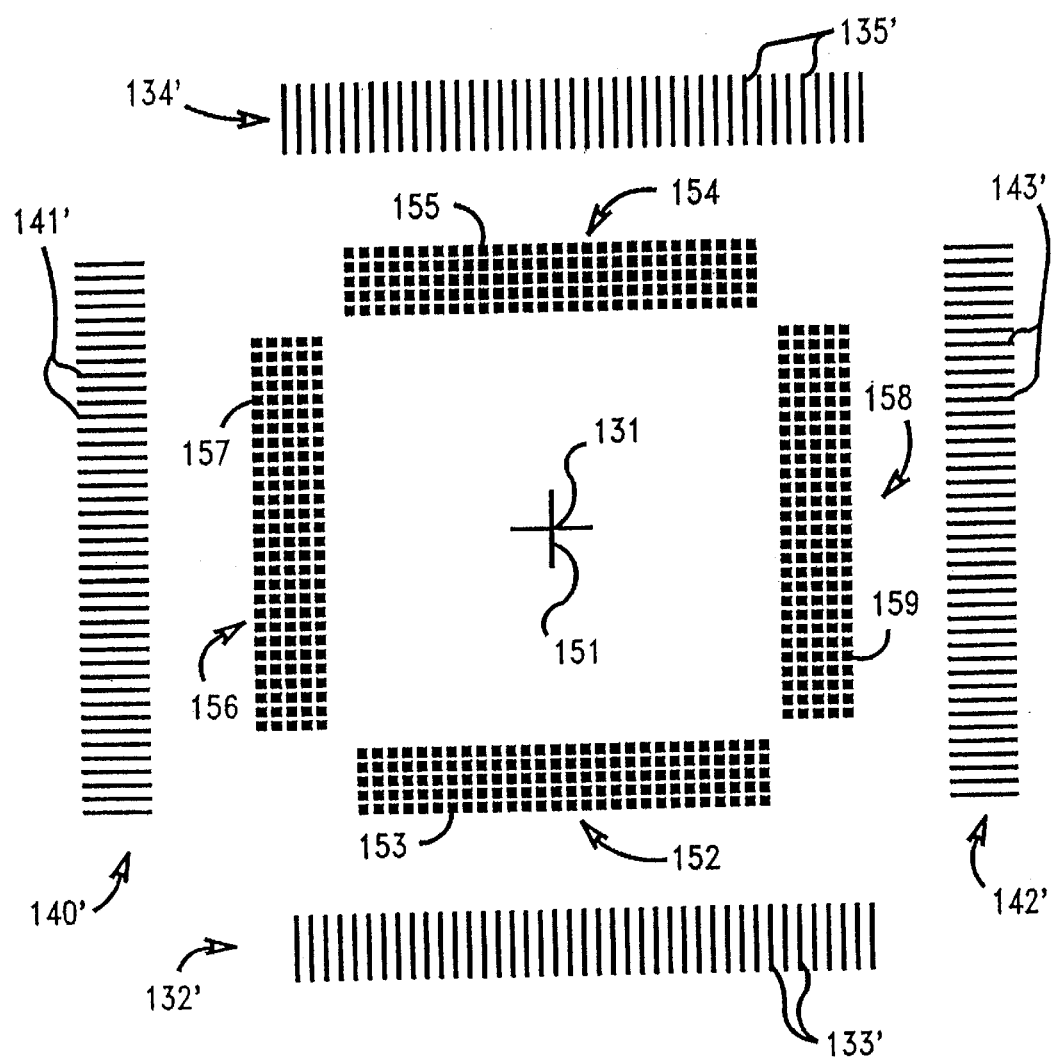
FIG. 24 is a top plan view of another embodiment of overlay target arrays, similar to those of FIG. 18, useful in connection with the present invention.

A benefit of keeping the FOV at approximately 50 um square is that it enables the inclusion of multiple CD targets in a single FOV. With the appropriate software, multiple targets can be measured simultaneously on a single intensity trace across the FOV. The different targets could represent different characteristics of the lithographic process, as illustrated in FIGS. 2–6 or they could provide an improved determination of the lithographic operating point, as in FIGS. 1 and the target disclosed in the aforementioned U.S. application Ser. Nos. 08/919,998, 08/921,986, and 08/929,341. In a manner analogous to overlay measurement the target layout and tool software could enable the simultaneous acquisition of CD performance in two or more orientations, as shown in FIG. 18 or in FIG. 24. The target of FIG. 24 is similar to FIG. 18, except that arrays 132' and 134' are oriented with elements 133', 135', respectively in the Y direction (elements lengths parallel to the Y-axis) and arrays 140' and 142' are oriented with elements 141', 143', respectively in the X direction (elements lengths parallel to the X-axis). Element spacing is equal to element width in arrays 132', 134', 140' and 142'. Opposite arrays are equidistant from target center point 131. Array pairs 132', 134' comprise separate targets wherein the nominal distance between facing edges of the array pairs (on the mask or reticle) is a predetermined, selected value. Likewise, array pairs 140', 142' also comprise separate targets arranged in a like manner. As with FIG. 18, to determine edge overlay, the image of target arrays 132', 134', 140' and 142' is exposed and etched on one level of a substrate and the image of target arrays 152, 154, 156 and 158 is exposed and etched on a different level of the substrate such that the center points 131, 151 of the target portions are coincident and the X and Y orientation of the respective element lengths are preserved. The bias and overlay error may be calculated for the X and Y directions by measurement of distances between edges within an array, or between arrays on the same or different levels. Measurements may be made during processing to check both exposure and development of the desired device pattern and subsequent etching of the pattern into the wafer substrate. The target depicted in FIG. 24 may also be used as a direct replacement for a conventional box-in-box target employed in the prior art.

Given the value of implementing both CD and overlay metrology on the same tool, it should be noted that none of the modifications to the prior art suggested by the present invention need come at the expense of overlay metrology performance. On the contrary, many synergies can be developed between CD and overlay metrology on the tool and system of the present invention. As chip dimensions shrink, there is an increasing need for overlay target dimensions to shrink. The same array designs developed for CD metrology are applicable to overlay metrology. Furthermore, the CD and overlay targets can be combined in such a way that both measurements are obtained simultaneously, as described in connection with FIGS. 18 or 24.

Thus, in the present invention, metrology resolution requirements are decoupled from the minimum feature size by integrating along the edges of regular arrays whose individual pattern elements have a size and patch representative of the minimum features and pitch of the chip pattern. The array dimensions can be arbitrarily large, making them resolvable by any microscopy technique. The pattern elements can be below the metrology resolution, so that there is no fundamental limit to feature size extendibility. The array edges move consistent with the dimensions of the individual pattern elements that comprise the array.

Additionally, there is achieved self-validation of measurement precision and sensitivity, since measurement sensitivity to substrate variation may be monitored by tracking the contrast of the optical image, and precision is monitored by tracking the pitch of adjacent arrays. Tone reversed targets, such as those disclosed in the aforementioned U.S. application Ser. Nos. 08/919,998, 08/921,986, 08/929,341 may be utilized to separate dose and focus dependence.

There is also achieved implementation of in-line CD and overlay metrology in a single optical tool. Measurement of the aforedescribed array targets enables measurement, data collection and analysis to be performed in a single step.

Array edge measurement and self-validation of precision and sensitivity enable one to circumvent the resolution and false sensitivity limitations of optical microscopy for CD metrology. Implementation in a single, in-line tool provides a pragmatic solution that reduces cost, cycle-time and complexity in the semiconductor manufacturing process.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. Metrology apparatus for determining bias or overlay error in a substrate formed by a lithographic process, said substrate including a target having an array of elements on a substrate, said array comprising a plurality of spaced, substantially parallel elements having a length and a width, the sum of the width of an element and the spacing of adjacent elements defining a pitch of said elements, edges of said elements being aligned along a line forming opposite array edges, the distance between array edges comprising the array width, the apparatus comprising:

- a light source;
- an object plane adapted to receive a substrate having thereon a target for determining bias or overlay error in said substrate, said target having an array of elements on a substrate, said array comprising a plurality of spaced, substantially parallel elements having a length and a width, the sum of the width of an element and the spacing of adjacent elements defining a pitch of said elements, edges of said elements being aligned along a line forming opposite array edges, the distance between array edges comprising the array width;
- an objective lens between said light source and said object plane adapted to focus light from said light source onto a target on said substrate in one direction and focus reflected light containing an image of said target in an opposite direction;
- an image plane adapted to receive light containing an image of a target reflected from said object plane; and
- an adjustable aperture between said objective lens and said image plane adapted to set the effective numerical aperture of said apparatus such that the pitch of said elements is less than or approximately equal to the ratio of the wavelength of the light source to the numerical aperture value of the metrology apparatus in the direction of the array edges, said metrology apparatus being capable of resolving said edges of said array and measuring the width of said array to determine bias or overlay error in said substrate.

2. The apparatus of claim 1 wherein said aperture is non-circular.

3. The apparatus of claim 1 wherein said aperture is rectangular.

4. The apparatus of claim 3 wherein said rectangular aperture is adjustable to individually vary the effective numerical aperture of said apparatus in horizontal and vertical directions.

5. The apparatus of claim 1 wherein said pitch of said elements is defined as P, wherein said wavelength of said light is defined as $\lambda$, wherein said numerical aperture is defined as NA, wherein the metrology apparatus has a partial coherence defined as $\sigma$, and wherein the numerical aperture and the partial coherence are adapted to be adjusted such that:

$$P < \text{or} \approx \frac{\lambda}{NA(1+\sigma)}$$

whereby individual elements are not resolved within said array of said target.

6. Metrology apparatus for determining bias or overlay error in a substrate formed by a lithographic process, said substrate including a target having an array of elements on a substrate, said array comprising a plurality of spaced, substantially parallel elements having a length and a width, the sum of the width of an element and the spacing of adjacent elements defining a pitch of said elements, said pitch of said elements being defined as P, edges of said elements being aligned along a line forming opposite array edges, the distance between array edges comprising the array width, the apparatus comprising:

- a light source having a light wavelength defined as $\lambda$;
- an object plane adapted to receive a substrate having thereon a target for determining bias or overlay error in said substrate;
- an objective lens between said light source and said object plane adapted to focus light from said light source onto a target on said substrate in one direction and focus reflected light containing an image of said target in an opposite direction;
- an image plane adapted to receive light containing an image of a target reflected from said object plane; and
- an adjustable, rectangular aperture between said light source and said image plane adapted to vary the effective numerical aperture of said apparatus, said apparatus having a numerical aperture defined as NA and a partial coherence defined as $\sigma$, and wherein the numerical aperture and the partial coherence are adapted to be adjusted such that:

$$P < \text{or} \approx \frac{\lambda}{NA(1+\sigma)}$$

whereby individual elements are not resolved within said array of said target.

7. The apparatus of claim 6 wherein said rectangular aperture is adjustable to individually vary the effective numerical aperture of said apparatus in horizontal and vertical directions.

8. The apparatus of claim 7 wherein said aperture is disposed between said objective lens and said image plane.

9. Metrology apparatus for determining bias or overlay error in a substrate formed by a lithographic process comprising:

- a light source;
- an object plane adapted to receive a substrate having thereon a target for determining bias or overlay error in said substrate, said target having an array comprising a plurality of spaced, substantially parallel elements having a length and a width, the sum of the width of an element and the spacing of adjacent elements defining a pitch of said elements, edges of said elements being aligned along a line forming opposite array edges, the distance between array edges comprising the array width;
- an objective lens between said light source and said object plane adapted to focus light from said light source onto a target on said substrate in one direction and focus reflected light containing an image of said target in an opposite direction;

a camera adapted to create a digital image of a target reflected from said object plane;

means for suppressing components of the digital image in the direction of the pitch of said elements, normal to the length of said elements; and means for resolving said edges of said array and measuring the width of said array to determine bias or overlay error in said substrate.

10. The apparatus of claim 9 wherein said means for suppressing components of the digital image comprises a microprocessor adapted to perform a fast Fourier transform on said digital image to convert image intensity to a spatial frequency domain and a filter to suppress high spatial frequency components of said image in the direction of the pitch of said elements.

11. A process for determining bias or overlay error in a substrate formed by a lithographic process comprising the steps of:

a) providing a target having an array of elements on a substrate, said array comprising a plurality of spaced, substantially parallel elements having a length and a width, the sum of the width of an element and the spacing of adjacent elements defining a pitch of said elements, edges of said elements being aligned along a line forming opposite array edges, the distance between array edges comprising the array width;

b) creating a digital image of said target;

c) suppressing components of the digital image in the direction of the pitch of said elements, normal to the length of said elements; and d) resolving said edges of said array and measuring the width of said array to determine bias or overlay error in said substrate.

12. The process of claim 11 wherein said step (c) comprises performing a fast Fourier transform on said digital image to convert image intensity to a spatial frequency domain and filtering out high spatial frequency components of said image in the direction of the pitch of said elements.

* * * * *